(12) United States Patent
Chouno et al.

(10) Patent No.: US 7,086,410 B2
(45) Date of Patent: Aug. 8, 2006

(54) SUBSTRATE PROCESSING APPARATUS AND SUBSTRATE PROCESSING METHOD

(75) Inventors: Yasuhiro Chouno, Tosu (JP); Norihiro Ito, Tosu (JP); Keigo Satake, Tosu (JP); Tadashi Iino, Nirasaki (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 10/384,089

(22) Filed: Mar. 7, 2003

(65) Prior Publication Data

US 2003/0170949 A1 Sep. 11, 2003

(30) Foreign Application Priority Data

Mar. 8, 2002 (JP) ............................. 2002-064107

(51) Int. Cl.
*G05D 16/20* (2006.01)
(52) U.S. Cl. .................. 137/14; 137/487.5; 137/613; 118/715; 438/935; 134/902
(58) Field of Classification Search ................. 137/14, 137/487.5, 613, 614.11; 118/715; 438/5, 438/935; 134/902
See application file for complete search history.

(56) References Cited

U.S. PATENT DOCUMENTS

| | | | | |
|---|---|---|---|---|
| 4,749,440 A | * | 6/1988 | Blackwood et al. | 438/706 |
| 4,980,204 A | * | 12/1990 | Fujii et al. | 117/98 |
| 5,222,310 A | | 6/1993 | Thompson et al. | |
| 5,286,523 A | * | 2/1994 | Matsuda et al. | 427/248.1 |
| 5,488,967 A | * | 2/1996 | Minami et al. | 137/1 |
| 5,573,023 A | | 11/1996 | Thompson et al. | |
| 5,685,912 A | * | 11/1997 | Nishizaka | 118/719 |
| 5,944,049 A | * | 8/1999 | Beyer et al. | 137/487.5 |
| 6,131,307 A | * | 10/2000 | Komino et al. | 34/486 |
| 6,142,163 A | * | 11/2000 | McMillin et al. | 137/14 |
| 6,333,268 B1 | * | 12/2001 | Starov et al. | 438/691 |
| 6,376,387 B1 | * | 4/2002 | Carlson et al. | 438/716 |
| 6,551,409 B1 | * | 4/2003 | DeGendt et al. | 134/2 |
| 6,729,041 B1 | * | 5/2004 | Shindo et al. | 34/444 |
| 6,817,368 B1 | * | 11/2004 | Toshima et al. | 134/95.3 |

FOREIGN PATENT DOCUMENTS

| | | |
|---|---|---|
| CN | 1300385 A | 6/2001 |
| JP | 7-77189 | 8/1995 |
| JP | 10015378 A * | 1/1998 |
| JP | 2002-353184 | 12/2002 |
| WO | WO-99/46653 | 9/1999 |

* cited by examiner

*Primary Examiner*—Ramesh Krishnamurthy
(74) *Attorney, Agent, or Firm*—Morrison & Foerster LLP

(57) ABSTRACT

A common solvent vapor supply source 41 and a common processing gas supply source 42 supply ozone gas and steam to a plurality of processing vessels 30A, 30B. Pressures in the processing vessels are regulated by adjusting the openings of the valuable throttle valves 50A, 50B, which are placed in exhaust lines 80A, 80B, respectively.

27 Claims, 13 Drawing Sheets

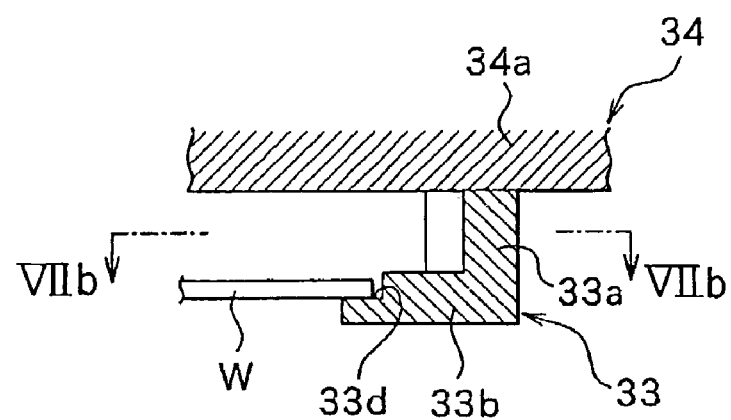
F I G. 7(a)
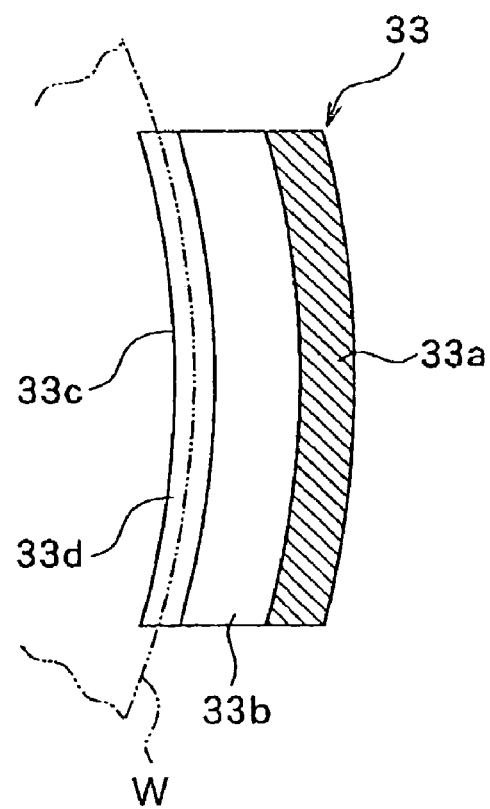
F I G. 7(b)

SUBSTRATE PROCESSING APPARATUS AND SUBSTRATE PROCESSING METHOD

BACKGROUND OF THE INVENTION

1. Field of the Invention

The present invention relates to an apparatus and a method for processing a substrate, such as a semiconductor wafer or a glass substrate for an LCD (liquid crystal display), in a sealed processing vessel with a processing fluid including a processing gas, such as ozone gas, and a solvent vapor, such as steam.

2. Description of the Related Art

Generally known semiconductor device fabricating process includes a series of steps of coating a surface of a semiconductor wafer or an LCD substrate (hereinafter referred to as "substrate") with a photoresist film, transferring a circuit pattern to the photoresist film by photolithography, developing the circuit pattern, and removing the photoresist film.

Recently, it is desired, in view of environmental protection, to remove the resist film without using any chemical solutions that cause problems in waste liquid disposal. A newly developed resist removing method proposed in recent years uses a processing gas, such as ozone gas ($O_3$ gas), and a solvent vapor, i.e., a vapor of a solvent in which processing gases are resolvable, such as steam, for removing a resist film from a substrate. This method places a substrate in a processing vessel, heats and pressurizes the interior of the processing vessel, and supplies a mixed processing containing ozone gas and steam into the processing vessel.

In carrying out this previously proposed method, it is important to set the interior of the processing vessel at a predetermined temperature and at a predetermined pressure in a short time in view of carrying out the method at a large throughput. A large quantity of the processing gas and a large quantity of solvent vapor must be supplied into the processing vessel and a heater having a large heating capacity is necessary when the processing vessel has a large volume.

The substrate processing apparatus may be provided with a plurality of processing vessels to increase throughput. If the substrate processing apparatus is provided with a plurality of processing gas sources and a plurality of solvent vapor sources respectively corresponding to the processing vessels, the scale of the substrate processing apparatus will be enlarged and the cost of the substrate processing apparatus increases. Such problems in the scale and cost of the substrate processing apparatus may be solved by using a common processing fluid source for the plurality of processing vessels. However, if the processing fluid is supplied from the common processing fluid source to the plurality of processing vessels simultaneously or sequentially at time intervals, it is possible that the pressures in the processing vessels vary and the substrates are not processed properly.

SUMMARY OF THE INVENTION

The present invention has been made in view of the foregoing circumstances and it is therefore an object of the present invention to provide a substrate processing apparatus capable of easily and properly controlling pressures in a plurality of processing vessels even if a processing fluid is supplied from a common processing fluid source to the plurality of processing vessels simultaneously, and a substrate processing method.

Another object of the present invention is to provide a processing vessel having a small size, thereby enabling controlling pressures easily and properly.

With the foregoing object in view, the present invention provides a substrate processing apparatus including: a plurality of processing vessels each configured to process a substrate therein; a plurality of processing gas supply lines each adapted to carry a processing gas from a processing gas source to each of the processing vessels; a plurality of solvent vapor supply lines each adapted to carry a solvent vapor from a solvent vapor source to each of the processing vessels; a plurality of exhaust lines each adapted carry the processing gas and the solvent vapor to discharge the processing gas and the solvent vapor from each of the processing vessel; and a plurality of devices that regulate pressures in the processing vessels, wherein each of the solvent vapor lines is provided with at least one of said plurality of devices, or each of the exhaust lines is provided with at least one of said plurality of devices.

In one preferred embodiment, each of the solvent vapor lines is provided with at least one of said plurality of devices. In this case, said at least one of the devices provided in each of the solvent vapor supply lines may include a variable throttle valve. In this case, the substrate processing apparatus may further include: a plurality of open-close valves, typically two-position valves, each provided in each of the solvent vapor supply lines to stop and permit a flow of the solvent vapor to each of the processing vessels; and a controller that regulates respective openings of the variable throttle valves in connection with opening-and-closing conditions of the open-close valves.

In another preferred embodiment, each of the solvent vapor lines is provided with at least one of said plurality of devices. In this case, each of the processing gas supply lines may be connected to a part, on a downstream side of said at least one of the devices provided in each of the solvent vapor supply lines, of each of the solvent vapor supply lines, thereby the processing gas is supplied to each of the processing vessel via each of the solvent vapor supply lines.

In another preferred embodiment, each of the exhaust lines is provided with at least one of said plurality of devices. In this case, said at least one of the devices provided in each of the exhaust lines may include a variable throttle valve. In this case, said at least one of the devices provided in each of the exhaust lines may further includes a relief valve placed in parallel to the variable throttle valve. Alternatively, said at least one of the devices provided in each of the exhaust lines may further includes an open-close valve placed in series with the variable throttle valve.

In the event that each of the exhaust lines is provided with a variable throttle valve, the substrate processing apparatus may further include: a plurality of pressure sensors each adapted to measure pressure in each of the processing vessels or pressure that varies according to a variation of the pressure in each of the processing vessels; and a controller that controls an opening of the each of the valuable throttle valves based on a result of an pressure measurement of each of the pressure sensors, so that a predetermined pressure is maintained in each of the processing vessels.

In the event that each of the exhaust lines is provided with a variable throttle valve and an open-close valve in series, the substrate processing apparatus may further include: a plurality of pressure sensors each adapted to measure pressure in each of the processing vessels or pressure that varies according to a variation of the pressure in each of the processing vessels; and a controller that controls an opening-and-closing operation of each of the open-close valves based on a result of an pressure measurement of each of the pressure sensors, so that a predetermined pressure is maintained in each of the processing vessels.

In the event that each of the exhaust lines is provided with a variable throttle valve and an open-close valve in series, the substrate processing apparatus may further include: a plurality of open-close valves each provided in each of the solvent vapor supply lines to stop and permit the flow of the solvent vapor into each of the processing vessels; and a controller that controls the open-close valves provided in the exhaust lines for an opening-and-closing operation in connection with opening-and-closing conditions of the open-close valves provided in the solvent vapor supply lines.

In the event that each of the exhaust lines is provided with a variable throttle valve, the substrate processing apparatus may further include: a plurality of open-close valves each provided in each of the solvent vapor supply lines to stop and permit the flow of the solvent vapor into each of the processing vessels; and a controller that controls respective openings of the variable throttle valves in connection with opening-and-closing conditions of the plurality of open-close valves.

In the event that each of the exhaust passage is provided with said at least one of the devices, it is preferable that fixed restrictors are placed respectively in the solvent vapor supply lines.

In another preferred embodiment, each of the processing vessels includes: a vessel body provided with a mount configured to support a substrate thereon, and a cover adapted to sealingly engage with the vessel body to define a processing space in the processing vessel, the cover having a substrate support member configured to support the substrate, the cover being configured so that the substrate is separated from the substrate support member of the cover and is supported on the mount of the vessel body when the cover engages with the vessel body.

The present invention further provides a substrate processing apparatus including: a first processing vessel configured to process a substrate therein; a second processing vessel configured to process a substrate therein; a first processing gas supply line adapted to carry a processing gas from a processing gas source into the first processing vessel; a second processing gas supply line adapted to carry the processing gas from the processing gas source into the second processing vessel; a first solvent vapor supply line adapted to carry a solvent vapor from a solvent vapor source into the first processing vessel; a second solvent vapor supply line adapted to carry the solvent vapor from the solvent vapor source into the second processing vessel; a first exhaust line adapted to carry the processing gas and the solvent vapor to discharge the processing gas and the solvent vapor from the first processing vessel; a second exhaust line adapted to carry the processing gas and the solvent vapor to discharge the processing gas and the solvent vapor from the second processing vessel; a first open-close valve placed in the first solvent vapor supply line; a second open-close valve placed in the second solvent supply line; a first variable throttle valve placed in the first exhaust line; a second variable throttle valve placed in the second exhaust line; and a controller that controls an opening of the first variable throttle valve such that an opening of the first variable throttle valve when both the first and the second open-close valves are opened is different from that of the first variable throttle valve when the first open-close valve is open and the second open-close valve is closed.

In one preferred embodiment, the substrate processing apparatus may further include: a third open-close valve placed in the first exhaust line in series with the first variable throttle valve; and a fourth open-close valve placed in the second exhaust line in series with the second variable throttle valve, wherein the controller is configured to control the third open-close valve for an opening-and-closing operation so that a predetermined pressure is maintained in the first processing vessel, and configured to control the fourth open-close valve for an opening-and-closing operation so that a predetermined pressure is maintained in the second processing vessel.

In another preferred embodiment, a first relief valve is placed in the first exhaust line in parallel to the first variable throttle valve, and a second relief valve is placed in the second exhaust line in parallel to the second variable throttle valve.

The present invention further provides a substrate processing apparatus including: a processing vessel configured to process a substrate therein; a supply line connected to the processing vessel to carry a mixed processing fluid containing a processing gas and a solvent vapor into the processing vessel; an exhaust line connected to the processing vessel and capable of carrying the mixed processing fluid to discharge the mixed processing fluid from the processing vessel; an open-close valve and a variable throttle valve placed in series in the exhaust line; and a controller that controls an opening of the variable throttle valve and controls the open-close valve for an opening-and-closing operation so that a predetermined pressure is maintained in the processing vessel.

According to the second aspect of the present invention, a substrate processing method is provided, which includes the steps of: supplying a processing gas and a solvent vapor in a first time period into a first processing vessel holding a first substrate therein; and supplying the processing gas and the solvent vapor in a second time period into a second processing vessel holding a second substrate therein; wherein the solvent vapor supplied into the first processing vessel and the solvent vapor supplied into the second processing vessel is supplied by a common solvent vapor source. The method further includes the steps of: regulating pressure in the first processing vessel in the first time period; and regulating pressure in the second processing vessel in the second time period, wherein; the step of regulating the pressure in the first processing vessel is achieved by adjusting an opening of a first variable throttle valve, and the first variable throttle valve is placed in a first solvent vapor supply line that carries the solvent vapor into the first processing vessel or in a first exhaust line that carries the solvent vapor and the processing gas to discharge the solvent vapor and the processing gas from the first processing vessel; the step of regulating the pressure in the second processing vessel is achieved by adjusting an opening of a second variable throttle valve, and the second variable throttle valve is placed in a second solvent vapor supply line that carries the solvent vapor into the second processing vessel or in a second exhaust line that carries the solvent vapor and the processing gas to discharge the solvent vapor and the processing gas from the second processing vessel; only a part of the first time period overlaps the second time period; and an opening of the first variable throttle valve in a state where the solvent vapor is being supplied to both the first and the second processing vessel, and an opening of the first variable throttle valve in a state where the solvent vapor is being supplied into the first processing vessel and is not being supplied into the second processing vessel, are different from each other.

In one preferred embodiment, the first variable throttle valve is placed in the first exhaust line, and the second variable throttle valve is placed in the second exhaust line.

Furthermore, a first relief valve may be placed in the first exhaust line in parallel to the first variable throttle valve, and a second relief valve may be placed in the second exhaust line in parallel to the second variable throttle valve. In this case, the substrate processing method may further include the steps of: supplying the processing gas into the first processing vessel without supplying the solvent vapor into the first processing vessel in a third time period preceding the first time period; supplying the processing gas into the second processing vessel without supplying the solvent vapor into the second processing vessel in a fourth time period preceding the second time period; regulating a pressure in the first processing vessel by using the first relief valve while the processing gas is being supplied into the first processing vessel in the third time period; and regulating the pressure in the second processing vessel by using the second relief valve while the processing gas is being supplied into the second processing vessel in the fourth time period.

In the event that the first and the variable throttle valves are placed in the first and the second exhaust lines, respectively, a first open-close valve may be placed in the first exhaust line in series with the first variable throttle valve, and a second open-close valve may be placed in the second exhaust line in series with the second variable throttle valve. In this case, the step of regulating the pressure in the first processing vessel during the first time period may include repetitively opening and closing the first open-close vale; and the step of regulating the pressure in the second processing vessel during the second time period may include repetitively opening and closing the second open-close vale.

The present invention further provides a substrate processing method including the steps of: supplying a processing gas and a solvent vapor into a processing vessel holding a substrate therein; and regulating pressure in the processing vessel; wherein the step of regulating the pressure in the processing vessel includes a step of adjusting an opening of a variable throttle valve and a step of repetitively opening and closing a open-close valve, and the variable throttle valve and the open-close valve are placed in series in an exhaust line connected to the processing vessel.

The present invention further provides a substrate processing method including the steps of: supplying a processing gas into a processing vessel holding a substrate therein in a first time period; supplying the processing gas and a solvent vapor into the processing vessel in a second time period subsequent to the first time period; regulating a pressure in the processing vessel in the first time period by using a relief valve; and regulating the pressure in the processing vessel in the second time period by adjusting an opening of a variable throttle valve; wherein the relief valve and the variable throttle valve are placed in parallel in an exhaust line connected to the processing vessel.

The step of regulating the pressure in the processing vessel in the second time period may includes a step of, in addition to regulating the opening of the variable throttle valve, repetitively opening and closing a open-close valve placed in the exhaust line in series with the variable throttle valve.

BRIEF DESCRIPTION OF THE DRAWINGS

FIG. 7(a) is an enlarged view of a part indicated at VIIa in FIG. 6;

FIG. 7(b) is a sectional view taken on line VIIb—VIIb in FIG. 7(a);

DESCRIPTION OF THE PREFERRED EMBODIMENTS

Preferred embodiments of the present invention will be described with reference to the accompanying drawings.

Figure 1:
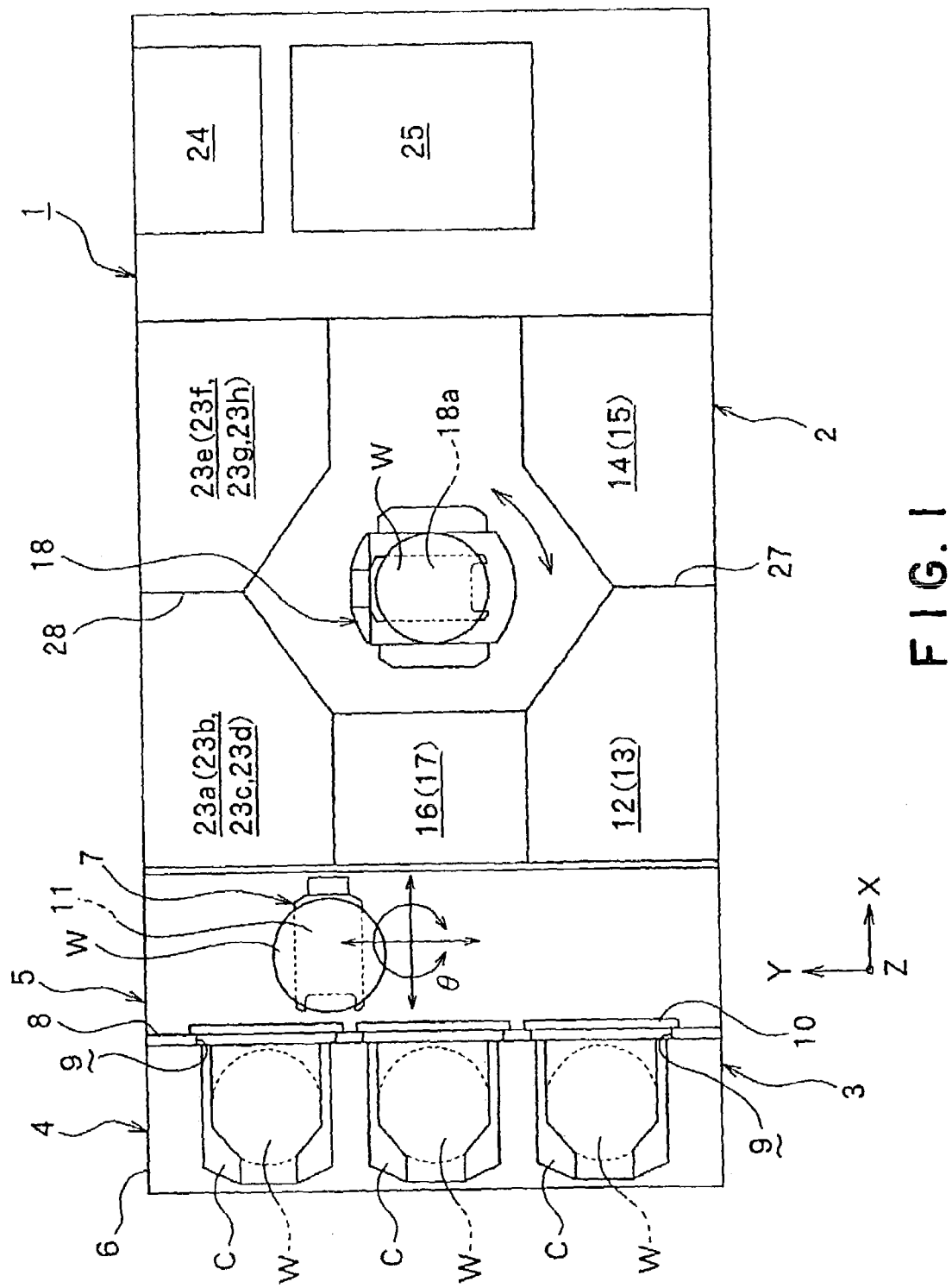
FIG. 1 is a schematic plan view of a substrate processing apparatus including a substrate processing apparatus in a first embodiment according to the present invention.
Figure 2:
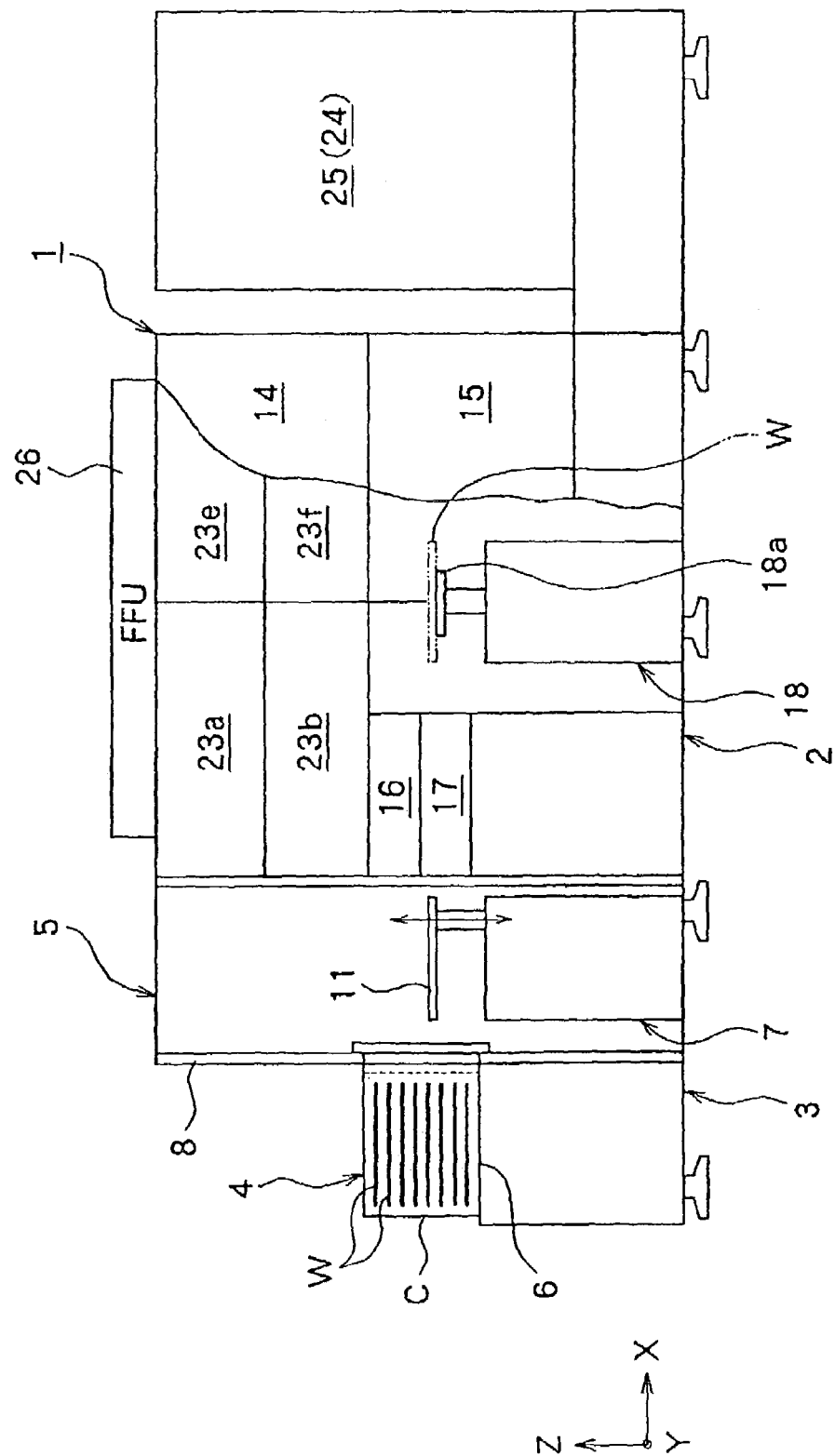
FIG. 2 is a schematic side elevation of the substrate processing system shown in FIG. 1.

A substrate processing system 1 including a substrate processing apparatus in a first embodiment according to the present invention will be described with reference to FIGS. 1 and 2. The substrate processing system 1 includes a processing section 2 for processing workpieces, such as semiconductor wafers W (hereinafter referred to simply as "wafer W") by a predetermined process, and a receiving/delivering section 3 for delivering and receiving wafers W to and from the processing section 2.

The receiving/delivering section 3 has an in/out port 4 including a table 6 for supporting wafer carriers C thereon, and a wafer carrying part 5 provided with a wafer conveyer 7 for transferring wafers W from the wafer carrier C placed on the table 6 to the processing section 2 and vice versa. The waver carrier C is capable of holding a plurality of unprocessed or processed wafers W, for example twenty-five wafers W.

The wafer carrier C has one side provided with an opening covered with a cover. The wafers W held in the wafer carrier C are accessible when the cover is opened. Shelves are supported on the inner surfaces of walls of the wafer carrier C to support wafers W at predetermined intervals. The shelves define twenty-five slots for accommodating wafers W. One wafer W is inserted in each of the slots with its major surface on which semiconductor devices are to be formed facing up.

A plurality of wafer carriers C, for example, three wafer carriers C, can be arranged horizontally along Y-direction on the table 6 of the in/out port 4. The wafer carrier C is placed on the table 6 with its side provided with the cover faced toward a partition wall 8 separating the in/out port 4 and the waver carrying part 5. Windows 9 are formed in the partition wall 8 at positions corresponding to positions where the wafer carriers C are placed on the table 6. The windows 9 are closed by shutters 10 installed on the side of the wafer carrying part 5 with respect to the windows 9.

A main unit of the wafer conveyer 7 placed in the wafer carrying part 5 is movable in horizontal directions (Y-directions), is movable in vertical directions (Z-directions), and is turnable in a horizontal plane (XY-plane) in θ-directions. The wafer conveyer 7 has a wafer transfer arm 11 mounted to the main unit and capable of holding and carrying a wafer W. The wafer transfer arm 11 is horizontally movable along the X-axis. Thus, the wafer conveyer 7 is capable of accessing every one of the slots, at different levels, of the wafer carriers C placed on the table 6 and each of two vertically arranged wafer relay units 16 and 17, and thus is capable of transferring the wafer W from the in/out port 4 to the substrate processing section 2 and vice versa.

The processing section 2 includes, a main wafer conveyer 18, said relay units 16 and 17, substrate cleaning units 12, 13, 14 and 15, and substrate processing units 23*a* to 23*h* which are the principal components of the substrate processing apparatus of the present invention. When a wafer W is transferred from the wafer conveyer 7 of the wafer carrying part 5 to the main wafer conveyer 18 and vice versa, the wafer W is kept temporarily in the relay unit 16 or 17.

The processing section 2 includes an ozone generator 24 that generates ozone gas, i.e., a processing gas, and a chemical storage unit 25 for storing a processing liquid to be supplied to substrate cleaning units 12 to 15. A fan filter unit (FFU) 26 is installed on the top wall of the substrate processing section 2 to supply clean air to those units and the main wafer conveyer 18.

Part of clean air blown downward by the FFU 26 flows through the relay units 16 and 17, a space extending over the relay units 16 and 17 into the wafer carrying part 5. Thus, contaminants, such as foreign particles, are prevented from migrating from the wafer carrying part 5 into the processing section 2 to maintain the interior of the processing section 2 clean.

The relay units 16 and 17 are stacked vertically. The lower relay unit 17 is used for temporarily holding a wafer W when the wafer W is transferred from the in/out port 4 to the processing section 2. The upper relay unit 16 is used for temporarily holding a wafer W when the wafer W is transferred from the processing section 2 to the in/out port 4.

The main unit of the main wafer conveyer 18 is movable in horizontal directions (X-directions) and vertical directions (Z-directions), and can be turned (θ-direction) in a horizontal plane (XY-plane) by a motor, not shown. Mounted on the main unit of the main wafer conveyer 18 is a carrying arm 18*a* capable of holding a wafer W. The carrying arm 18*a* is movable in horizontal directions (Y-directions in FIG. 1). Thus, the main wafer conveyer 18 is capable of accessing the relay units 16 and 17, the substrate cleaning units 12 to 15, and the substrate processing units 23*a* to 23*h*.

The substrate cleaning units 12, 13, 14 and 15 perform a cleaning and drying process to the wafers W having been subjected to a resist-solubilizing process by the substrate processing units 23*a* to 23*h*.

The substrate cleaning units 12, 13, 14 and 15 are of substantially the same construction, except that the substrate cleaning units 12 and 13, and the substrate cleaning units 14 and 15 are symmetrical with respect to a partition wall 27.

The substrate processing units 23*a* to 23*h* are configured to perform the resist-solubilizing process, which makes a hydrophobic, water-insoluble resist film formed on the wafer W water-soluble. The four substrate processing units 23*d*, 23*c*, 23*b* and 23*a* are stacked vertically in that order on one side of a partition wall 28, and the four substrate processing units 23*h*, 23*g*, 23*f* and 23*e* are stacked vertically in that order on the other side of the partition wall 28. The substrate processing units 23*a*, 23*b*, 23*c* and 23*d* on the left-hand side, as viewed in FIG. 1, of the partition wall 28 and the substrate processing units 23*e*, 23*f*, 23*g* and 23*h* on the right-hand side, as viewed in FIG. 1, of the partition wall 28 are substantially the same in construction, except that the substrate processing units 23*a*, 23*b*, 23*c* and 23*d* and the substrate processing units 23*e*, 23*f*, 23*g* and 23*h* are symmetrical with respect to the partition wall 28.

Figure 3:
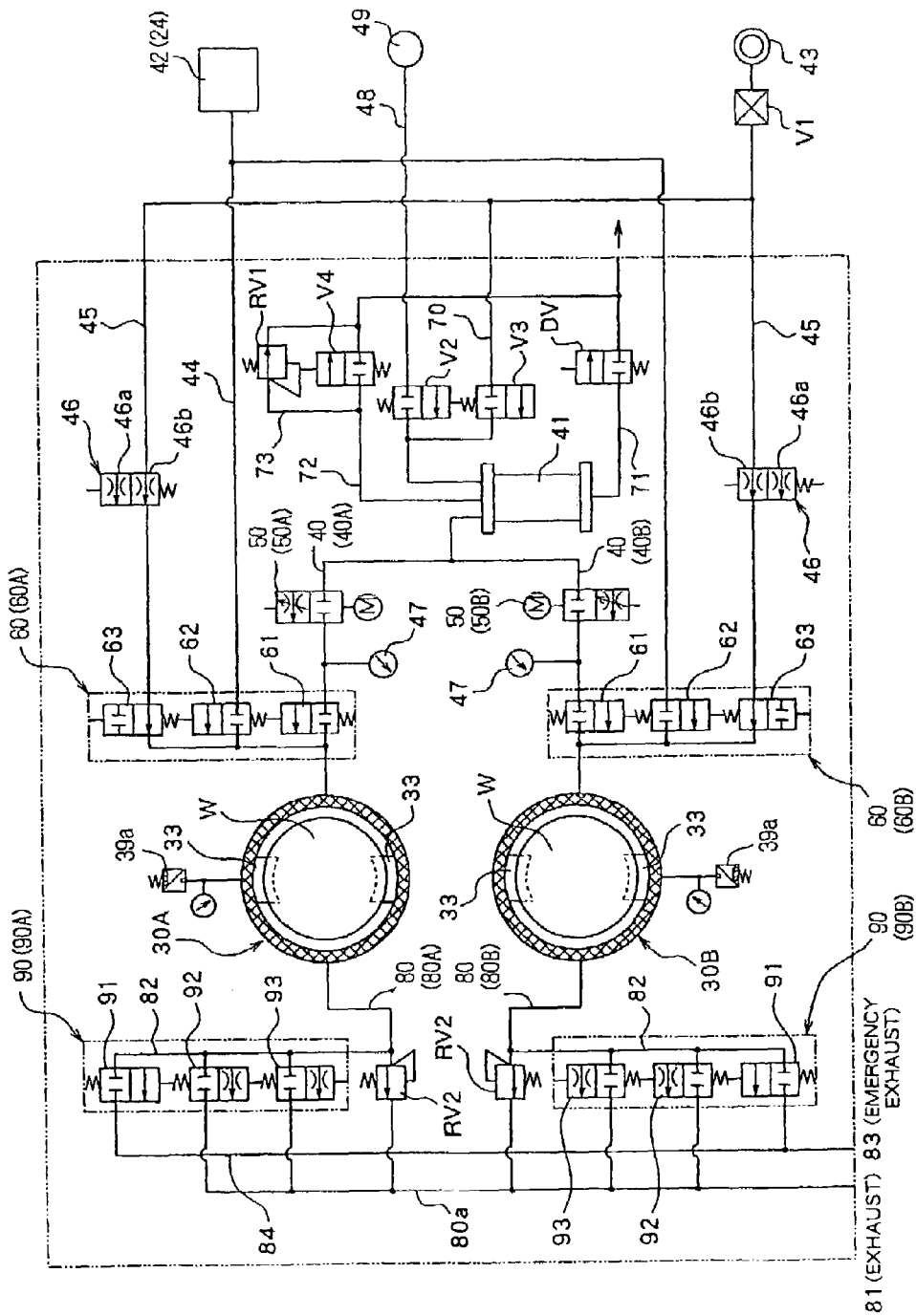
FIG. 3 is a piping diagram of the piping system of the substrate processing apparatus shown in FIG. 1.

The construction of the substrate processing units will be described. The construction of the substrate processing units 23*a* and 23*b* will be described by way of example. FIG. 3 is a piping diagram of a piping system associated with the substrate processing units 23*a* and 23*b*, and of a piping system of a substrate processing apparatus according to the present invention. The substrate processing units 23*a* and 23*b* are provided with processing vessels 30A and 30B, respectively. The processing vessels 30A and 30B are connected to a common steam generator 41, i.e., a solvent vapor source, by solvent vapor supply lines 40 (40A and 40B), respectively. The solvent vapor supply lines 40A and 40B are provided with variable throttle valves 50 (50A and 50B), which are means for regulating pressures in the processing vessels 30A and 30B, respectively.

Figure 4:
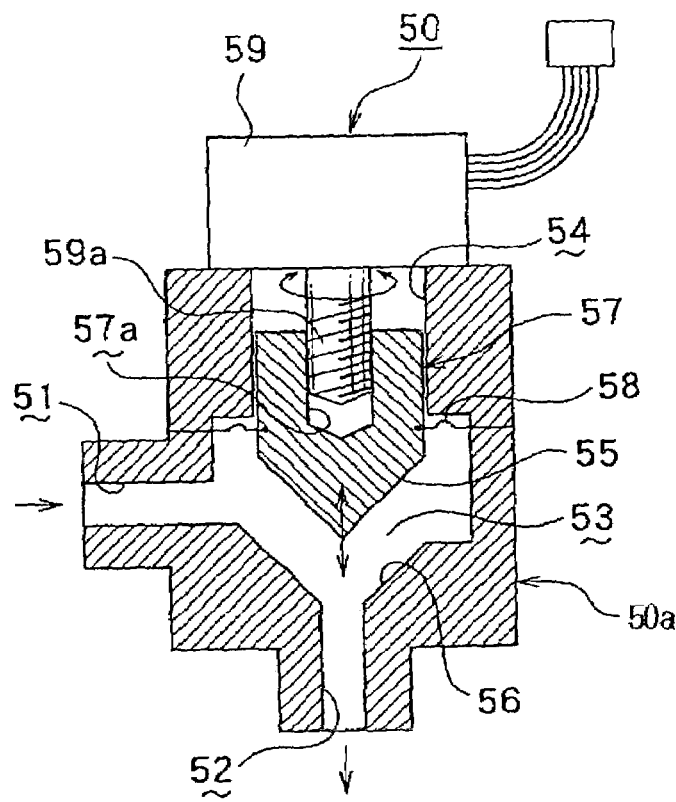
FIG. 4 is a sectional view of a variable throttle valve shown in FIG. 3.

Referring to FIG. 4, the variable throttle valve 50 has a valve body 50*a* provided with: an inlet port 51 connected by a line to the steam generator 41; an outlet port 52 formed at the lower end thereof and connected by a line to the processing vessel 30A (30B); a connecting passage 53 connecting the inlet port 51 and the outlet port 52; a valve seat 56 formed at the bottom of the connecting passage 53; and a hole 54 extending upward from the passage 53. A valve element 57 is vertically movably fitted in the hole 54. The valve element 57 is provided with a threaded hole 57*a*. A diaphragm 58 is attached to the outer surface of the valve element 57 and the inner surface of the valve body 50*a*. A screw rod 59*a* is screwed in the threaded hole 57*a* of the valve element 57. The bottom face 55 of the valve element 57 can be seated on the valve seat 56. The screw rod 59*a* can be turned in opposite directions by a servomotor 59.

Steam supply rate at which steam is supplied through the solvent vapor supply line 40 to the processing vessel 30A (30B) is adjusted by driving the servomotor 59 to adjust the opening of the variable throttle valve 50. The pressure in the processing vessel 30A (30B) is dependent on the respective flow rates of ozone gas and steam supplied into the processing vessel 30A (30B). Thus, the pressure in the processing vessel 30A (30B) can be regulated by adjusting the opening of the variable throttle valve 50.

A common ozone generator 42, i.e., a processing gas source, and a common air source 43 are connected through supply selectors 60 (60A, 60B) to parts of the solvent vapor supply lines 40 (40A, 40B) on the downstream side (secondary side) of the variable throttle valves 50 (50A, 50B). Each of the supply selectors 60 includes a first two-position valve (i.e., open-close valve) 61 for opening or closing the solvent vapor supply line 40, a second two-position valve 62 (i.e., open-close valve) for opening or closing an ozone gas supply line 44, and a third two-position valve 63 (i.e., open-close valve) for opening or closing an air supply line 45. The air supply line 45 is provided with a flow selector valve 46 including a high-flow restrictor 46a and a low-flow restrictor 46b, and a two-position valve V1.

Figure 5:
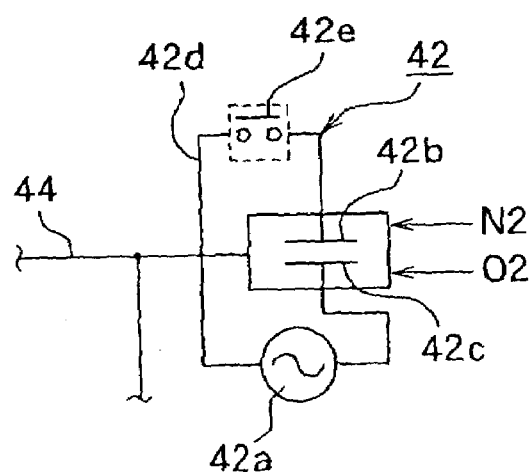
FIG. 5 is a diagrammatic view of an ozone generator shown in FIG. 3.

Referring to FIG. 5, the ozone generator 42 generates ozone ($O_3$) by passing oxygen gas ($O_2$), i.e., a source gas, through the gap between discharge electrodes 42b and 42c and applying a high-frequency voltage across the discharge electrodes 42b and 42c by a high-frequency power source 42a. An electric circuit 42d connecting the high-frequency power source 42a to the discharge electrodes 42b and 42c is provided with a switch 42e. The switch 42e is controlled by a control signal provided by a system controller, not shown, for controlling the operation of the substrate processing system 1.

Referring again to FIG. 3, a pressure gage 47 is connected to a part, between the variable throttle valve 50 and the supply selector 60, of the solvent vapor supply line 40. A pure water source 49 is connected to the steam generator 41 by a pure water supply line 48 provided with a two-position valve V2. The air source 43 is connected to a part, on the downstream side (secondary side) of the two-position valve V2, of the pure water supply line 48 by a branch line 70 provided with a two-position valve V3. The two-position valves V2 and V3 can be set in an open state or a closed state. A drain line 71, provided with a drain valve DV interlocked with the two-position valve V3, is connected to a drain port of the steam generator 41. Pure water remaining in the steam generator 41 is drained through the drain line 71. A pure water discharge line 72 has one end connected to the drain line 71 and the other end connected to the inlet port of the steam generator 41. The pure water discharge line 72 is provided with a two-position valve V4. A branch line 73 provided with a relief valve RV1 has one end connected to the upstream side (primary side) of the two-position valve V4 and the other end connected to the downstream side (secondary side) of the same.

Exhaust lines 80 (80A, 80B) are connected to parts of the processing vessels 30A and 30B, which are opposite to parts to which the solvent vapor supply lines 40 (40A, 40B) are connected. The exhaust lines 80 are connected through relief valves RV2 to exhaust ports (EXHAUST) 81 of the substrate processing units 23a and 23b, respectively. A branch exhaust line 82 provided with an exhaust selector 90 is connected to the upstream side (primary side) of the relief valve RV2 of each exhaust line 80. The exhaust selector 90 includes a first two-position valve 91 (i.e., open-close valve), which remains closed in a normal state and opens in an emergency, a second two-position valve 92 (i.e., open-close valve) with a small-diameter restrictor that permits discharge at a low flow rate when opened, and a third two-position valve 93 (i.e., open-close valve) with a large-diameter restrictor that permits discharge at a high flow rate when opened. An emergency exhaust line 84 connected to an emergency exhaust port (EMERGENCY EXHAUST) 83 is connected to the downstream sides (secondary sides) of the first two-position valves 91 of the exhaust selector 90. An exhaust line 80A connected to an exhaust port (EXHAUST) 81 is connected to the second two-position valves 92 and the third two-position valves 93. A cooling device and a mist trap, which are not shown, for separating a gas containing ozone gas from a liquid, and an ozone killer, not shown, for converting ozone gas separated from the liquid into oxygen through thermal decomposition are connected to the exhaust port 81 and the emergency exhaust port 83.

Figure 6:
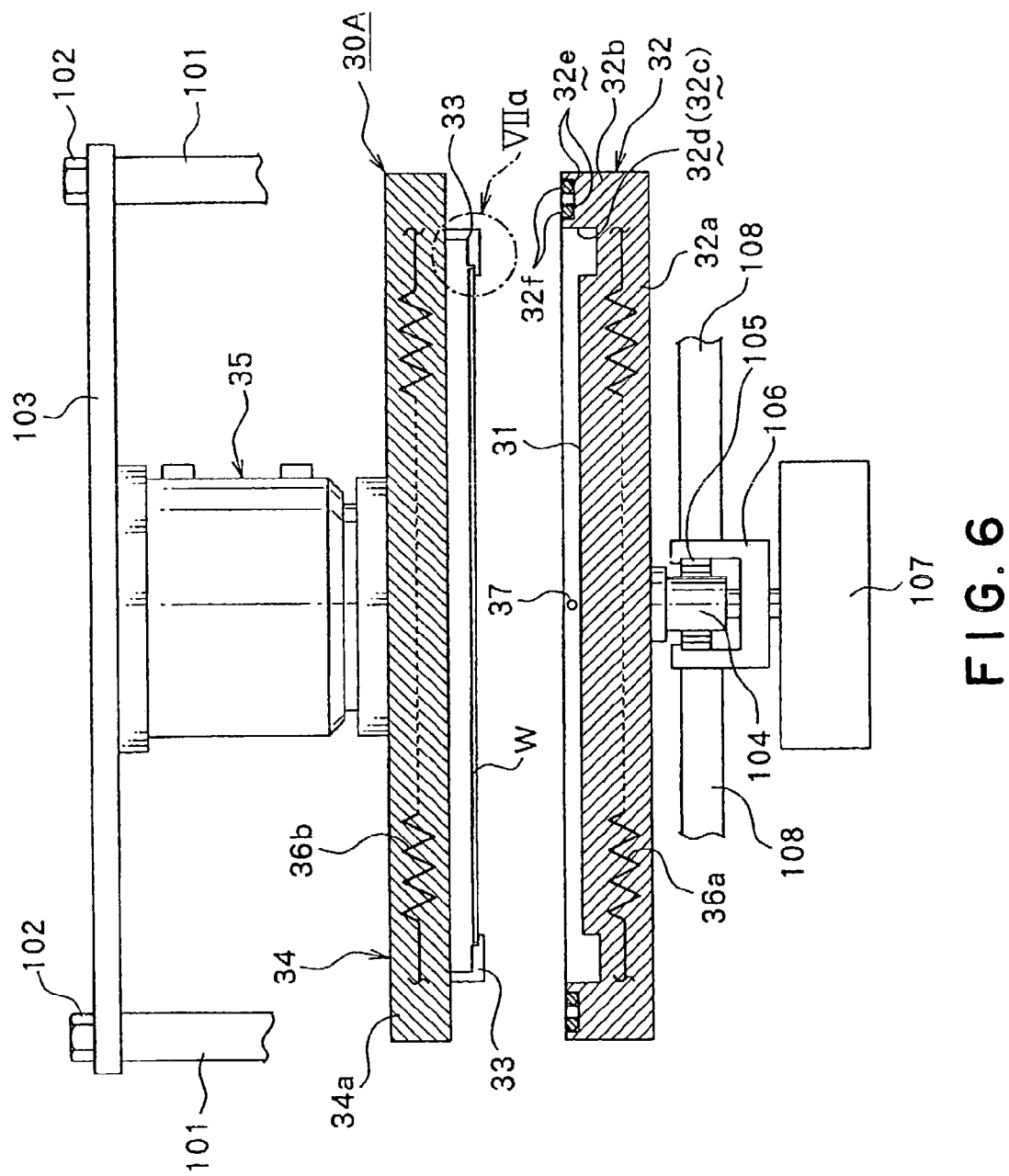
FIG. 6 is a sectional view of a processing vessel shown in FIG. 3 in an open state.
Figure 8:
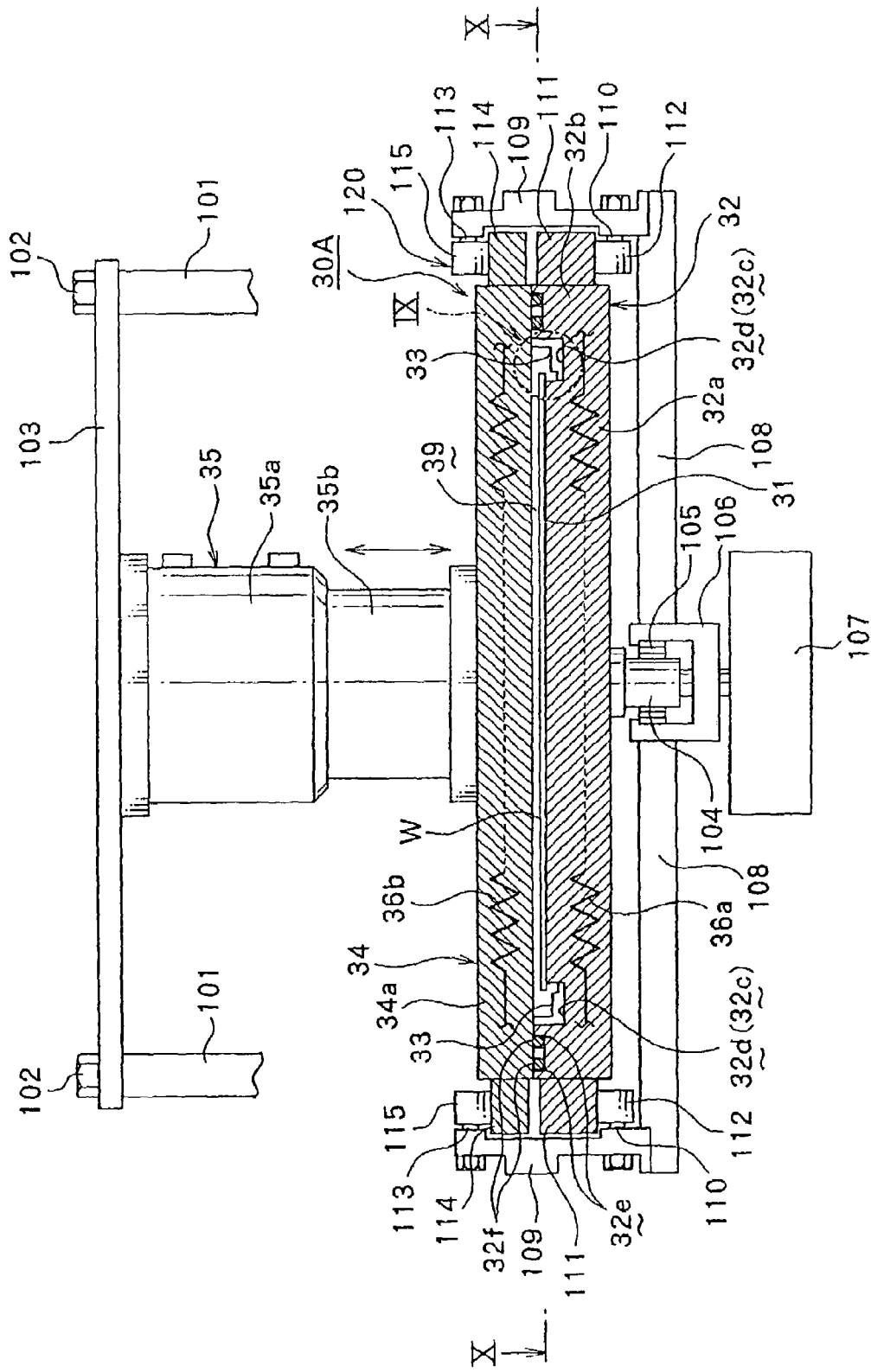
FIG. 8 is a sectional view of the processing vessel shown in FIG. 6, in a closed state.

The processing vessels 30A and 30B will be described. As shown in FIGS. 6 and 8, the processing vessel 30A has a vessel body 32 and a cover 34. The vessel body 32 is provided with a protruding mount 31 for supporting a wafer W thereon. The cover 34 is provided with support members 33. The main wafer conveyer 18 carries a wafer W onto the support members 33. A cylinder actuator 35 moves the cover 34 vertically. The cover 34 is separated from the vessel body 32 when a wafer W is transferred from the main wafer conveyer 18 to the support members 33 and vice versa. The cover 34 is joined closely to the vessel body 32 while a wafer W supported on the mount 31 is being processed. Heaters 36a and 36b are embedded in the vessel body 32 and the cover 34 of the processing vessel 30A, respectively. The heaters 36a and 36b heats the vessel body 32 and the cover 34 to maintain the interior of the processing vessel 30A at a predetermined temperature. Only the vessel body 32 may be provided with the heater 36a if desired temperature control is possible. A locking mechanism 121 keeps the vessel body 32 and the cover 34 joined together in an airtight fashion. A leakage detector 39a is attached to the processing vessel 30A to monitor the leakage of the processing fluid from the processing vessel 30A.

Figure 9:
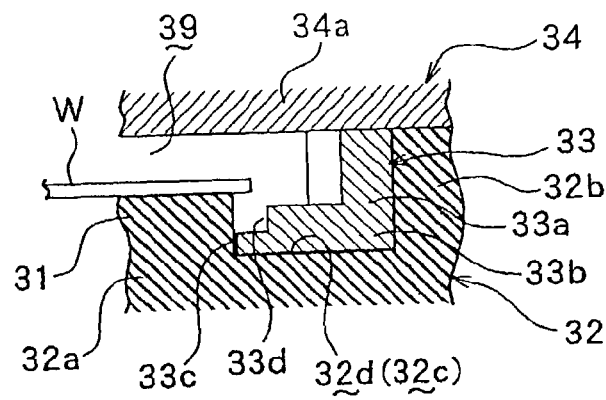
FIG. 9 is an enlarged view of a part indicated at IX in FIG. 8.
Figure 10:
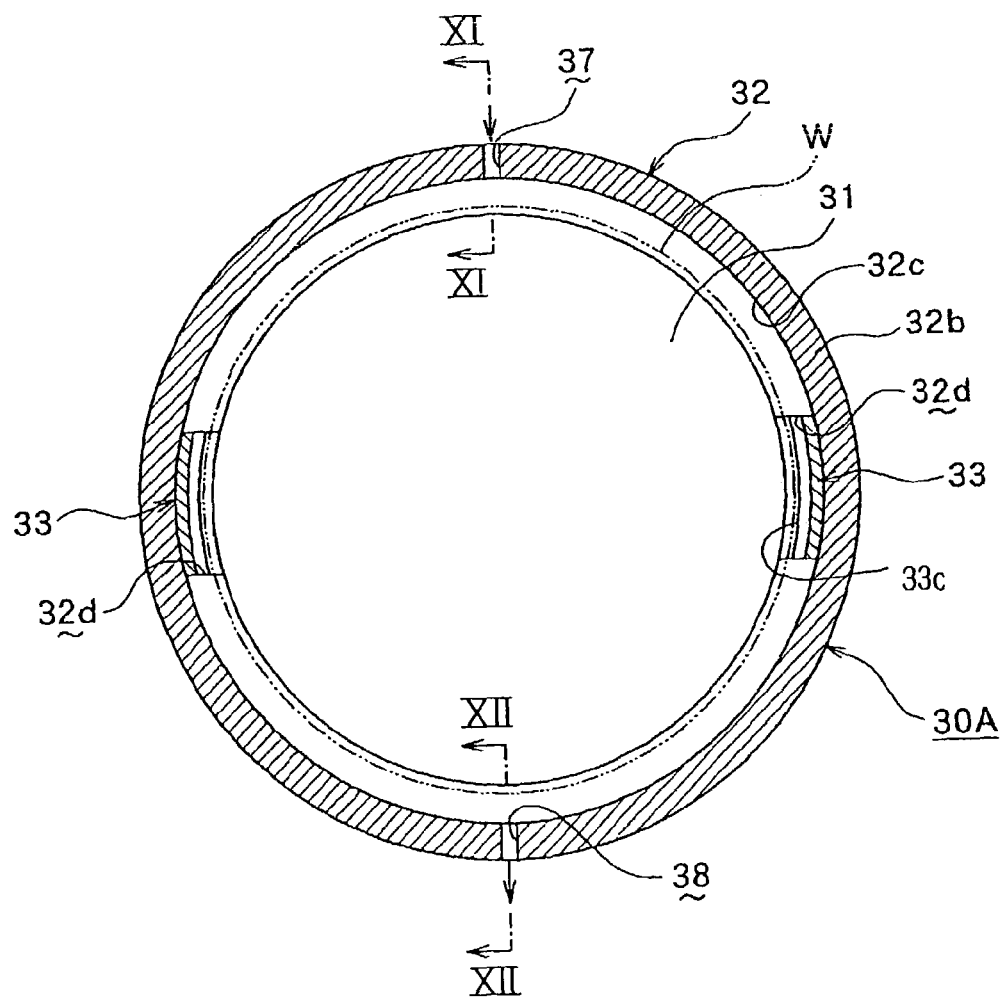
FIG. 10 is a cross-sectional view of the processing vessel shown in FIG. 6.

Referring to FIGS. 9 and 10, the cover 34 has a disk-shaped body 34a. The heater 36b is embedded in the body 34a, and the support members 33 are attached to diametrically opposite parts of the lower surface of the body 34a so as to project downward. As shown in FIG. 7, each support member 33 has an L-shaped cross section, and has a leg part 33a projecting perpendicularly downward from the inner surface of the body 34a and a horizontal support part 33b extending radially inward from the lower end of the leg part 33a. The horizontal support part 33b has an inner edge 33c having the shape of a circular arc whose curvature substantially matches that of outer circumference of the protruding mount 31. A step 33d on which a peripheral part of a wafer W is seated is formed in the upper surface of an edge part of the horizontal support part 33b.

Referring to FIGS. 6, 8 and 10, the vessel body 32 has a disk-shaped base part 32a, the circular mount 31 protruding from the upper surface of the base 32a and having a diameter slightly smaller than that of a wafer W, and a peripheral wall 32b rising from the periphery of the base part 32a. The heater 36a is embedded in the base part 32a. The height of the peripheral wall 32b from the lower surface of the base part 32a is greater than that of the upper surface of the mount 31. An annular groove 32c is formed between the peripheral wall 32b and the mount 31. Cavities 32d are formed in diametrically opposite parts of the annular groove 32c. The support members 33 are received in the cavities 32d when the cover 34 is put on the vessel body 32. Two concentric circular grooves 32e are formed in the upper surface of the peripheral wall 32b, and O-rings 32f are fitted in the circular grooves 32e.

Figure 11:
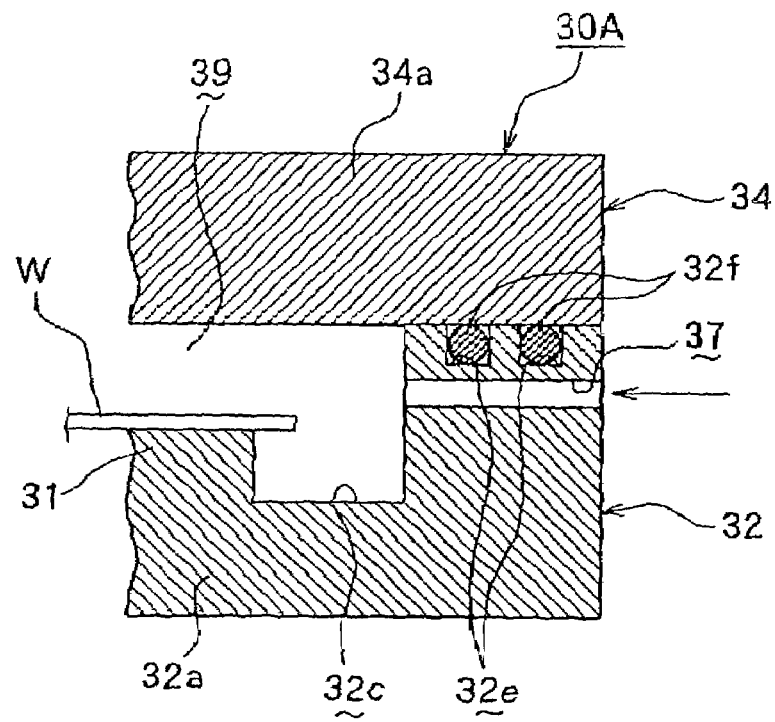
FIG. 11 is an enlarged sectional view taken on line XI—XI in FIG. 10.
Figure 12:
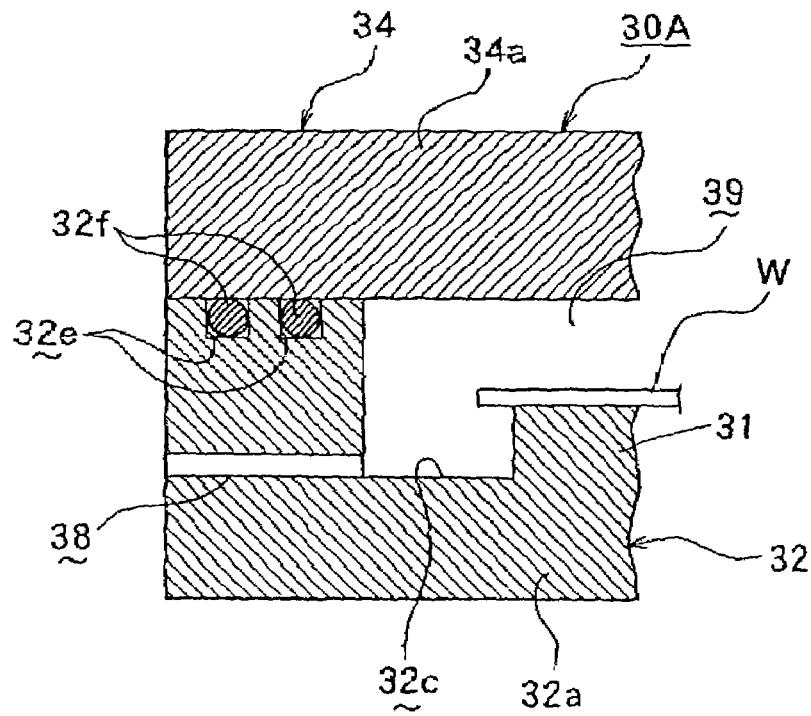
FIG. 12 is an enlarged sectional view taken on line XII—XII in FIG. 10.

As shown in FIG. 10, the peripheral wall 32b is provided with a supply port 37 and an exhaust port 38 in its parts at an angular distance of 90° from positions corresponding to the two cavities 32d, respectively. The solvent vapor supply line 40 is connected to the supply port 37, and the exhaust line 80 is connected to the exhaust port 38. The supply port 37 opens into a space above the annular groove 32c as shown in FIG. 11. The exhaust port 38 opens in a bottom part of the annular groove 32c as shown in FIG. 12. Thus, the processing fluid, i.e., the mixed fluid of ozone gas and steam, can be smoothly supplied into a space 39 between the vessel body 32 and the cover 34 of the processing vessel 30A, and the processing fluid remaining in the processing vessel 30A after the completion of the process can be completely discharged from the processing vessel 30A. The peripheral wall 32b of the vessel body 32 may be provided with a plurality of supply ports 37.

Figure 13A:
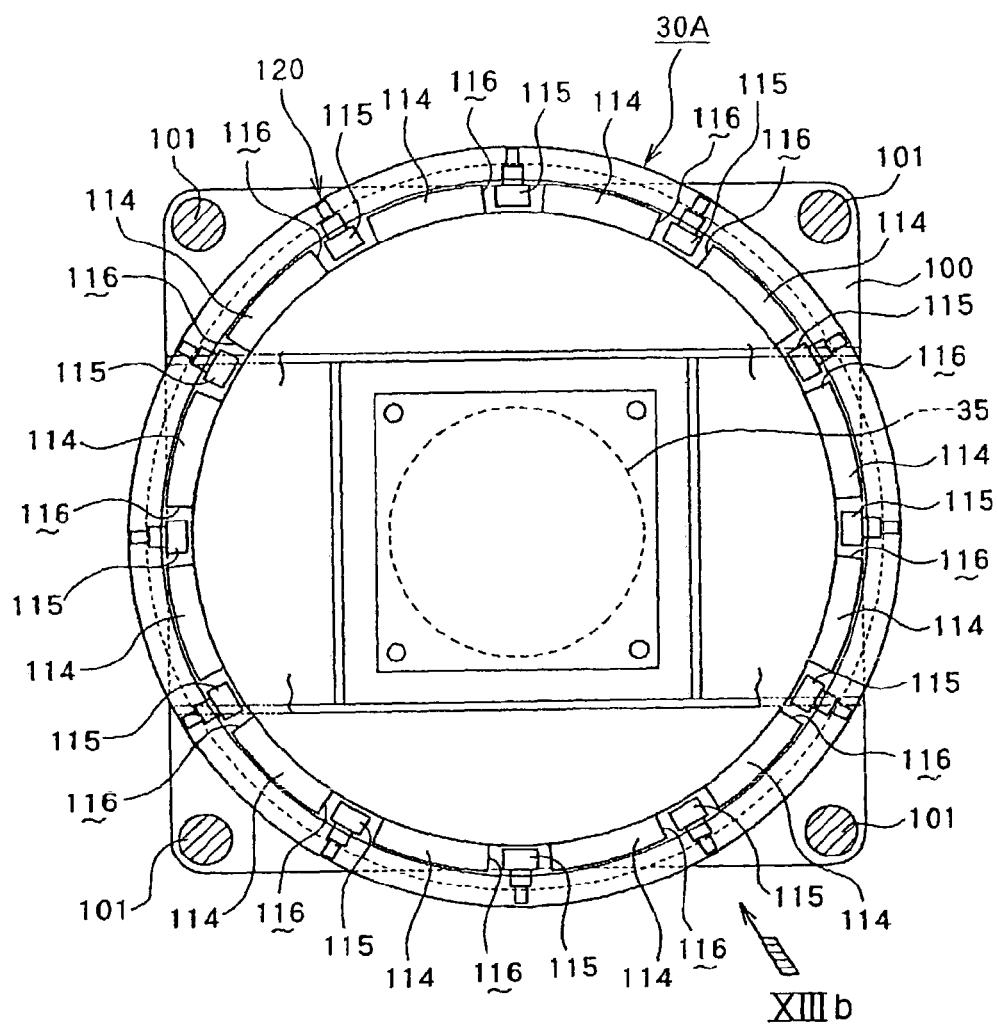
FIG. 13(a) is a plan view of a locking mechanism incorporated into the processing vessel.

Referring to FIGS. 6, 8 and 13, the cylinder actuator 35 has a cylinder body 35a, and a piston rod 35b projecting downward from the cylinder body 35a and fixed to the upper surface of the cover 34. Four columns 101 are set upright on a rectangular, fixed plate 100 (see FIG. 13), and a top plate 103 is fastened to upper end parts of the columns 101 with bolts 102. The cylinder body 35a is fastened to the lower surface of the top plate 103 in a vertical position. The cover 34 is raised and is separated from the vessel body 32 when the piston rod 35b is retracted into the cylinder body 35a. The cover 34 is lowered and is pressed against the upper surface of the peripheral wall 32b of the vessel body 32, compressing the O-rings 32f so that the processing vessel 30A is sealed.

Figure 13B:
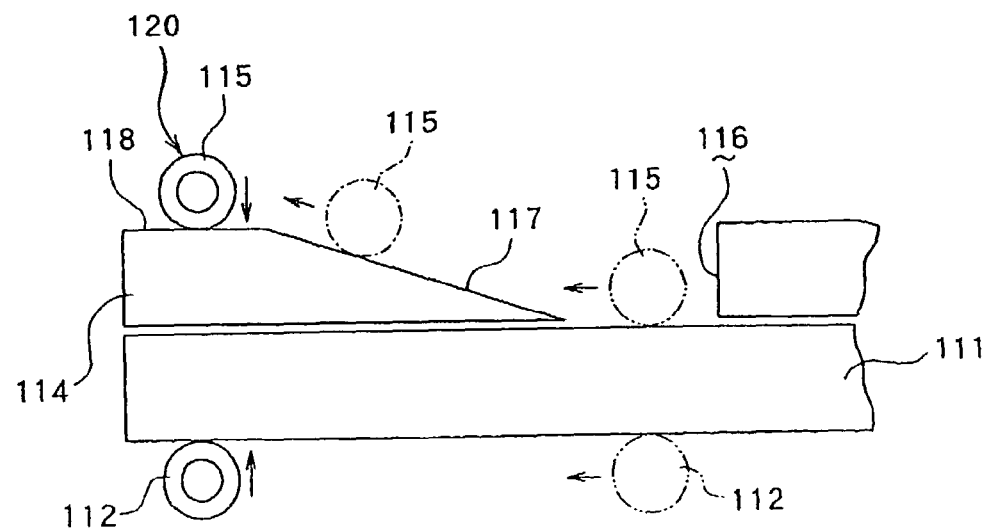
FIG. 13(b) is an enlarged view taken in the direction of the arrow XIIIb in FIG. 13(a)

The locking mechanism 120 will be described with reference to FIGS. 8 and 13. A rotary tube 106 is born for rotation by a bearing 105 put on a support shaft 104 projecting downward from a central part of the lower surface of the base part 32a of the vessel body 32. The rotary tube 106 can be turned in opposite directions by a rotary actuator 107. A disk 107 is put on the rotary tube 106. Twelve brackets 109 are fastened in an upright position to the periphery of the disk 108. A horizontal lower shaft 110 projects radially inward from a lower part of each bracket 109, and a lower locking roller 112 is supported for rotation on the horizontal lower shaft 110. The lower locking roller 112 can be engaged with the lower surface of a lower protrusion 111 radially projecting from the periphery of the base part 32a. A horizontal upper shaft 113 projects radially inward from an upper part of each bracket 109, and an upper locking roller 115 is supported for rotation on the horizontal upper shaft 113. The upper locking roller 115 can be engaged with the upper surface of an upper projection 114 radially projecting from the periphery of the cover 34. The lower projection 111 is an annular member continuously extending along the circumference of the base part 32a. The upper projections 114 are arranged at angular intervals on the circumference of the cover 34. Gaps 116 of a width slightly greater than the diameter of the upper locking rollers 115 are formed between the adjacent upper projections 114. As shown in FIG. 13(b), the upper surface of each upper projection 114 has a slope 117 sloping up from an end, i.e., a left-hand end as viewed in FIG. 13(b), of the gap 116, and a flat horizontal surface 118 extending from the upper end of the slope 117.

When the disk 108 is turned together with the rotary tube 106 by the rotary actuator 107 with the cover 34 being joined to the vessel body 32, the lower locking rollers 112 roll along the lower surface of the lower projection 111, while the upper locking rollers 115 roll up the slopes 117 of the upper projections 114 to the horizontal surfaces 118. Thus, the lower projection 111 of the base part 32a of the vessel body 32 and the upper projections of the cover 34 are held between the twelve sets each of the lower locking roller 112 and the upper locking roller 115 of the locking mechanism 120 to lock the vessel body 32 and the cover 34 together. In this state, the O-rings 32f are compressed between the vessel body 32 and the cover 34 to seal the processing vessel 30A.

In unlocking the vessel body 32 and the cover 34, the rotary tube 106 is turned in the reverse direction to turn the lower locking rollers 112 and the upper locking rollers 115 to their waiting positions. The waiting positions of the upper locking rollers 112 are in the gaps 116. In this state, the piston rod 35b the cylinder actuator 35 is retracted to separate the cover 34 from the vessel body 32.

Steps of a process of processing a wafer W by the substrate processing system 1 will be described. The wafer transfer arm 11 takes one wafer W from the carrier C placed on the table 6 of the in/out port 4, and transfers the wafer W to the wafer relay unit 17. Then, the main wafer conveyer 18 receives the wafer W from the relay unit 17. The main wafer conveyer 18 delivers the wafer W to designated one of the substrate processing units 23a to 23h. The above operation is carried out repeatedly. Then, the substrate processing units 23a to 23h carry out a resist-solubilizing process.

After the completion of the resist-solubilizing process, the carrying arm 18a of the wafer conveyer 18 removes the wafers W from the substrate processing units 23a to 23h, and delivers the wafers W to the cleaning units 12, 13, 14 and 15. Then, the substrate cleaning units 12, 13, 14 and 15 perform a cleaning process using a cleaning liquid, such as pure water, to remove the solubilized resist films from the wafers W. Thus, the resist films coated on the surfaces of the wafers W are removed. When necessary, the substrate cleaning units 12, 13, 14 and 15 perform a metal contaminant removing process using a chemical solution to remove particles and metal contaminants from the wafers W. The carrying arm 18a carries the wafer W thus processed to the wafer relay unit 17. Then, wafer transfer arm 11 transfers the wafer W from the relay unit 17 to the carrier C.

The operation of the substrate processing unit 23a using the processing vessel 30A will be described as a representative example of the operations of the substrate processing units 23a and 23h. The cover 34 is separated from the vessel body 32, and the carrying arm 18a, holding a wafer W, of the main wafer conveyer 18 carries the wafer W into a space under the cover 34 and puts the wafer W on the support members 33 of the cover 34. Then, the cylinder actuator 35 is driven to lower the cover 34 toward the vessel body 32. While the cover 34 is thus being lowered, the wafer W supported on the support members 33 is placed on the protruding mount 31 of the vessel body and is separated from the support members 33 as the supporting members 33 sink in the cavities 32d of the vessel body 32. The cover 34 is lowered further after the wafer W has been mounted on the protruding mount 31, and the cover 34 is pressed against the upper surface of the peripheral wall 32b of the vessel body 32 to seal the processing vessel 30A.

After the processing vessel 30a has been thus sealed, the heaters 36a and 36b are energized to heat the interior of the processing vessel 30A and the wafer W. Then, the second two-position valve 62 of the supply selector 60A is opened to supply ozone gas of a predetermined ozone concentration from the ozone gas generator 42 through the ozone gas supply line 44 into the processing vessel 30A to create an ozone gas atmosphere in the processing vessel 30A. The interior of the processing vessel 30A is maintained at a pressure higher than the atmospheric pressure, such as a gage pressure of 0.2 MPa. The heaters 36a and 36b are controlled so that the interior of the processing vessel 30A and the wafer W are maintained at predetermined temperatures, respectively. Thus, the resist-solubilizing process can be promoted. A fluid discharged from the processing vessel 30A through the exhaust line 80A is carried to a mist trap, not shown.

Then, the first two-position valve 61 and the second two-position valve 62 of the supply selector 60A are opened, to supply steam simultaneously with ozone gas into the processing vessel 30A to process the wafer W by the resist-solubilizing process. During the resist-solubilizing process, the opening of the variable throttle valve 50A is adjusted to regulate the flow rate of steam so that the interior of the processing vessel 30A is regulated at a predetermined pressure. The third two-position valve 93 of the exhaust selector 90A placed in the exhaust line 80A is opened to discharge the fluid from the processing vessel 30A while ozone gas and steam are being supplied simultaneously into the processing vessel 30A. The temperature of steam generated by the steam generator 41 and flowing through the solvent vapor supply line 40A is regulated at a predetermined temperature of, for example, about 115° C. by a temperature regulator, not shown. The steam thus heated at the predetermined temperature is mixed with ozone gas by the supply selector 60A, and the mixture of steam and ozone gas is supplied into the processing vessel 30A. In this state, the interior of the processing vessel 30A is maintained at the predetermined pressure higher than the atmospheric pressure, such as a gage pressure on the order of 0.2 MPa. The heaters 36a and 36b are controlled so that the interior of the processing vessel 30A and the wafer W are maintained at the predetermined temperatures, respectively. The resist film coating the surface of the wafer W is made water-soluble by the oxidizing effect of the mixed fluid of ozone gas and steam filling the processing vessel 30A. Since the support members 33 are received in the cavities 32d formed in the vessel body 32, a processing space, i.e., the space 39 between the vessel body 32 and the cover 34, can be formed in a very small volume. Thus, a pressure control operation for controlling the pressure in the processing vessel 30A (particularly, a pressure raising control operation) can be achieved at a high response speed, the consumption of the processing fluid (ozone gas and steam) can be reduced, and the processing vessel 30A and hence the substrate processing unit can be formed in small dimensions.

During the resist-solubilizing process, the mixed processing fluid is supplied continuously through the solvent vapor supply line 40A, while the mixed processing fluid is discharged continuously through the exhaust line 80. As shown in FIGS. 11 and 12, the mixed processing fluid is introduced through the supply port 37 connected to the solvent vapor supply line 40A into a space over the upper surface of the wafer W, and the mixed processing fluid is discharged through the exhaust port 38, which is diametrically opposite to the supply port 37, connected to the exhaust line 80A and opening into a space under the wafer W. Consequently, the mixed processing fluid introduced into the space over the upper surface of the wafer W flows through the processing space 39 formed between the upper surface of the wafer W and the cover 34 toward the exhaust port 38. The mixed processing fluid flows also along the circumference of the wafer W toward the exhaust port 38.

The resist-solubilizing process may be carried out by stopping supplying the mixed processing fluid through the solvent vapor supply line 40A, stopping discharging the mixed processing fluid through the exhaust line 80A, maintaining a fixed pressure in the processing vessel 30A and using the mixed processing fluid filling up the processing vessel 30A. The two-position valves of the supply selector 60A and the two-position valves of the exhaust selector 90A are closed for such a processing mode.

After the completion of the resist-solubilizing process, the mixed processing fluid of ozone gas and steam is discharged completely from the processing vessel 30A. In discharging the used mixed processing fluid from the processing vessel 30A, the flow selector valve 46 is set such that air flows through the high-flow restrictor 46a to supply dry, clean air from the air source at a high flow rate into the processing vessel 30A via the supply selector 60A, and the third two-position valve 93 of the exhaust selector 90 is opened.

Dry air is supplied from the air source 43 into the processing vessel 30A while the used mixed processing fluid is being discharged from the processing vessel 30A through the exhaust line 80A. Thus, the solvent vapor supply line 40A, the processing vessel 30A and the exhaust line 80A can be cleaned and purged by dry air. The used mixed processing fluid is discharged through the exhaust line 80A into the mist trap, not shown.

Subsequently, the cylinder actuator 35 is operated to raise and separate the cover 34 from the vessel body 32. As the cover 34 is thus raised, the support members 33 rise from the cavities 32d, lift up the wafer W from the protruding mount 31. Then, the carrying arm 18a of the main wafer conveyer 18 advances into the space under the cover 34, takes up the wafer W from the support members 33, and carries the wafer W away from the processing vessel 30A.

A method of regulating pressures in the processing vessels 30A and 30B when the supply of steam and ozone gas into the processing vessel 30B is started while steam and ozone gas are being supplied into the processing vessel 30A for the resist-solubilizing process will be described. A procedure for supplying a fluid, such as ozone gas or purging air, into the processing vessel 30B before starting the supply of steam into the processing vessel 30B and after the completion of the fluid supplying operation is the same as that carried out for the processing vessel 30A.

Steam is supplied also to the processing vessel 30B by the following procedure in a state where the variable throttle valve 50A placed in the solvent vapor supply line 40A connected to the processing vessel 30A is adjusted properly and steam is being supplied into the processing vessel 30A.

Suppose that the processing vessel 30B has been heated at a desired temperature and has been filled up with ozone gas. Then, the opening of the variable throttle valve 50B placed in the solvent vapor supply line 40B connected to the processing vessel 30B is adjusted properly, the first two-position valve 61 of the supply selector 60B is opened to start supplying steam into the processing vessel 30B.

When the selector valve 61 placed in the solvent vapor supply line 40B connected to the processing vessel 30B is opened to start supplying steam into the processing vessel 30B, the opening of the variable throttle valve 50A placed in the solvent vapor supply line 40A through which steam is flowing is reduced. Consequently, a sudden pressure change in the processing vessel 30A can be prevented. Although the steam supply rate at which steam is supplied to the processing vessel 30A decreases in this state, there is an allowable range for the steam-ozone supply rate ratio between steam and ozone gas, and hence the reduction of the supply rate of steam does not affect the resist-solubilizing process adversely, provided that the steam-ozone supply rate ratio is within the allowable range.

After the pressure in the processing vessel 30B has stabilized, the variable throttle valves 50A and 50B are adjusted so that the respective openings of the variable throttle valves 50A and 50B are substantially equal. Consequently, steam is supplied at equal supply rates into the processing vessels 30A and 30B, and the interiors of the processing vessels 30A and 30B are maintained at equal pressures, respectively.

A system controller, not shown, regulates the respective openings of the variable throttle valves 50A and 50B. Control data for regulating the openings of the variable throttle valves 50A and 50B is stored beforehand in the system controller. The control data is designed such that the change of the openings of the variable throttle valves 50A and 50B with time is controlled to limit the pressure changes in the processing vessels 30A and 30B to the least possible extent when the processing vessel 30B starts operations for the resist-solubilizing process while the processing vessel 30A is in operation for the resist-solubilizing process. The control data is obtained empirically through experiments using the substrate processing system.

While the processing vessels 30A and 30B are in operation, the second two-position valves 92 and the third two-position valves 93 of the exhaust selectors 90A and 90B placed in the exhaust lines 80A and 80B may be selectively opened. Thus, the pressures in the processing vessels 30A and 30B can be more accurately and easily regulated.

Although the single steam generator 41 is connected to the two processing vessels 30A and 30B in this embodiment, the single steam generator 41 may be connected to three or more processing vessels. When the single steam generator 41 is connected to three or more processing vessels, the openings of the variable throttle valves 50 may be regulated according to the number of the simultaneously used processing vessels. For example, the openings of the variable throttle valves 50 are reduced to an opening equal to ⅓ of the full opening when the three processing vessels are used simultaneously, and to an opening equal to ¼ of the full opening when four processing vessels are used simultaneously.

Although the electric variable throttle valves 50 operated by the servomotors 59 are used as means for regulating the pressure in the processing vessels in this embodiment, any suitable pressure regulating means known in the field of fluid control technology may be used instead of the electric variable throttle valves 50. In this specification, the term "variable throttle valve" refers to not only a typical variable throttle valve, but also to a flow control valve included in a mass-flow controller.

Figure 14:
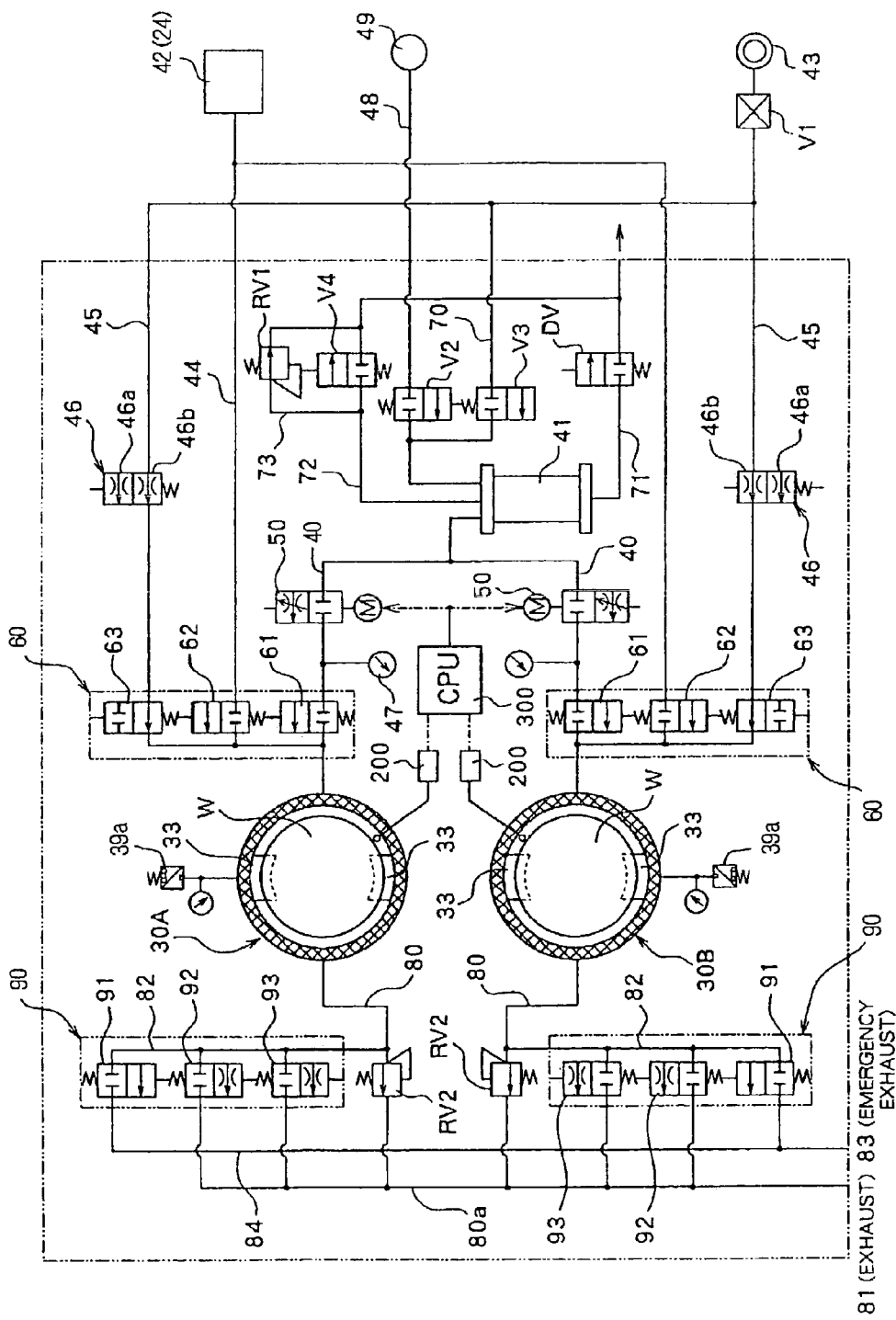
FIG. 14 is a piping diagram of a piping system included in a substrate processing apparatus in a second embodiment according to the present invention.

Although the foregoing embodiment controls the opening of the variable throttle valve 50 on the basis of the opening control data stored beforehand in the system controller, the opening of the variable throttle valve 50 may be regulated by a feedback control operation on the basis of measured data on the pressure in the processing vessel 30. FIG. 14 shows a piping system included in a substrate processing apparatus in another embodiment according to the present invention. In the piping system shown in FIG. 14, the respective openings of the variable throttle valves 50 are regulated by measuring pressures in the processing vessels 30A and 30B during the processing vessels 30A and 30B are in operation by pressure sensors 200, i.e., pressure measuring means, placed in the processing vessels 30A and 30B, transmitting signals provided by the pressure sensors 200 to a central processing unit (CPU) 300, i.e., a controller, and controlling the servomotors 59 of the variable throttle valves 50 by control signals provided by the CPU 300. The piping system shown in FIG. 14 is identical in other respects with the piping system of the foregoing embodiment. Therefore parts like or corresponding to those of the piping system of the substrate processing apparatus shown in FIG. 1 are denoted by the same reference characters and the description thereof will be omitted.

A substrate processing apparatus in another embodiment according to the present invention will be described with reference to FIG. 15. The piping system shown in FIG. 15 differs from that shown in FIG. 3 in the following respects:

(1) The variable throttle valves 50A, 50B are moved from the solvent vapor supply lines 40A, 40B to positions downstream of the third two-position valves 93 of the exhaust selectors 90A, 90B and are connected to the outlet ports of third two-position valves 93, respectively.

(2) The pressure gages 47 are moved from the solvent vapor supply lines 40A, 40B to the exhaust lines 80A, 80B. The pressure gages 47 are placed just downstream of the processing vessels 30A and 30B and upstream of the relief valves RV2 and exhaust selector 90.

(3) The third two-position valve 93 included in each of the exhaust selectors 90 is an ordinary two-position valve without a restrictor.

(4) The solvent vapor supply lines 40 (40A and 40B) are provided with orifice plates 120, respectively. The orifice plates 120, or fixed restrictors, are effective in maintaining the pressure in the steam generator 41 always at a high level and stabilizing steam generation.

Figure 15:
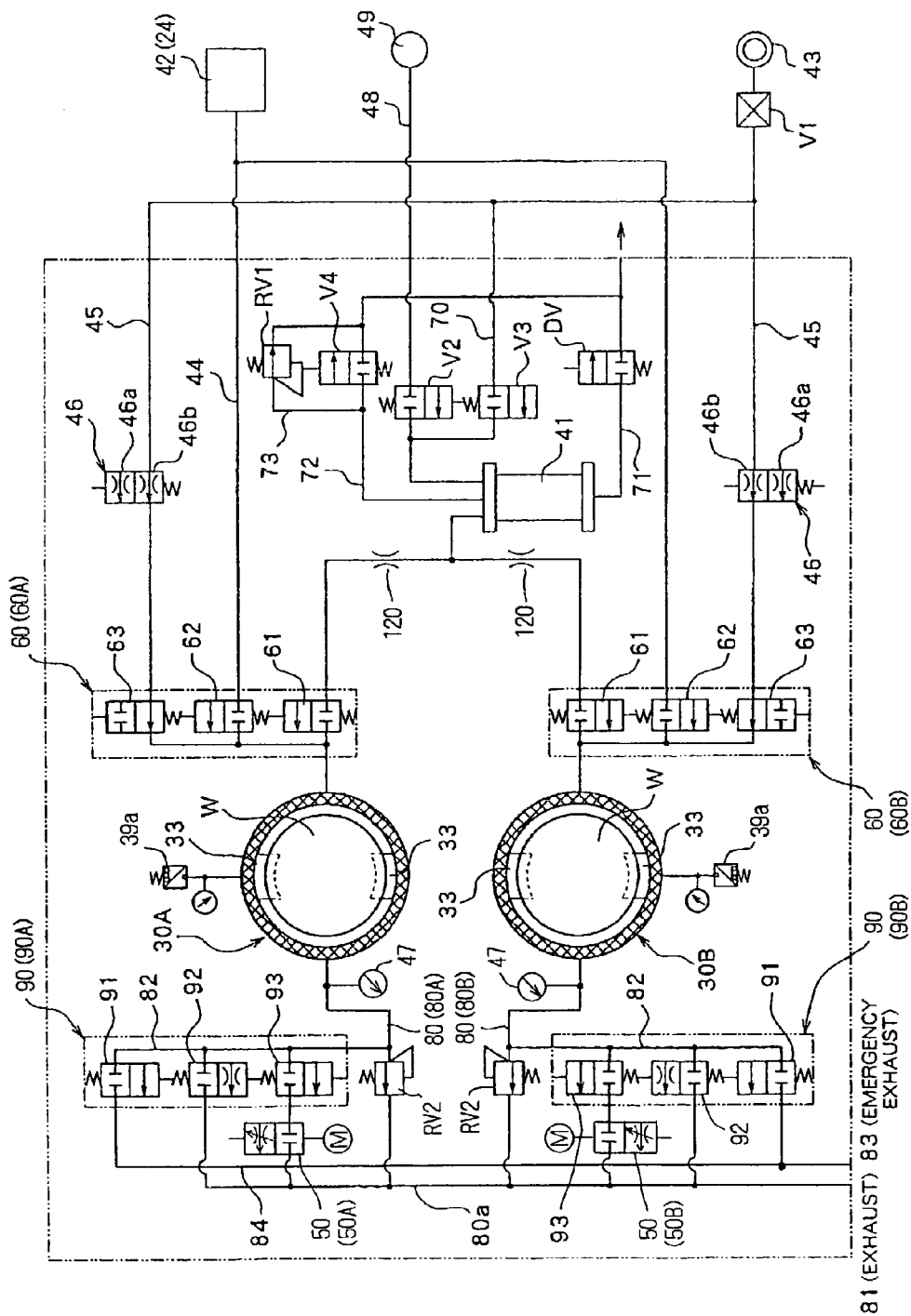
FIG. 15 is a piping diagram of a piping system included in a substrate processing apparatus in a third embodiment according to the present invention.

The piping system shown in FIG. 15 is identical with that shown in FIG. 3 in other respects and hence further description thereof will be omitted to avoid duplication.

After a wafer W has been placed in the processing vessel 30a, the heaters 36a and 36b are energized to heat the interior of the processing vessel 30A and the wafer W. Then, the second two-position valve 62 of the supply selector 60A is opened to supply ozone gas of a predetermined ozone concentration from the ozone gas generator 42 through the ozone gas supply line 44 into the processing vessel 30A to create an ozone gas atmosphere in the processing vessel 30A. The interior of the processing vessel 30A is maintained at a pressure higher than the atmospheric pressure, such as a gage pressure of 0.2 MPa by the relief valve RV2, with the first, second and third two-position valves 91, 92, 93 of the exhaust selector 90A kept closed. The heaters 36a and 36b are controlled so that the interior of the processing vessel 30A and the wafer W are maintained at predetermined temperatures, respectively, after a desired ozone gas atmosphere has been established.

Then, the first and the second two-position valves 61, 62 of the supply selector 60A are opened to supply ozone gas simultaneously with steam into the processing vessel 30A to process the wafer W by a resist-solubilizing process. During the resist-solubilizing process, the first two-position valve 91 and the second two-position valve 92 of the exhaust selector 90A are kept closed, and the third two-position valve 93, i.e., open-close valve 93, of the exhaust selector 90A is kept opened. The opening of the variable throttle valve 50A on the downstream side of the third two-position valve 93 is regulated to maintain the pressure in the processing vessel 30A at a predetermined level, for example, a pressure higher than the atmospheric pressure, such as a gage pressure of 0.2 MPa.

When a plurality of processing vessels (30A, 30B) are used simultaneously for the resist solubilizing process, the openings of the variable throttle valves (50A, 50B) are regulated according to the number of the processing vessels being used. In the embodiment of FIG. 15, the variable throttle valves 50A, 50B are on the downstream side of the processing vessels 30A and 30B, respectively. Therefore, the pressures in the processing vessels can be raised by reducing the openings of the variable throttle valves 50. Thus, the pressures in the processing vessels can be easily regulated.

If the resist solubilizing process is started in the processing vessel 30B while the resist solubilizing process is in progress in the processing vessel 30A, it is preferable to reduce the opening of the variable throttle valve 50A of the exhaust line 80A temporarily in starting supplying steam into the processing vessel 30B, and thereafter to adjust both the variable throttle valves 50A and 50B to even openings. This procedure suppresses the sudden reduction of the pressure in the processing vessel 30A upon the start of supplying steam into the processing vessel 30B.

The change of the openings of the variable throttle valves 50A and 50B with time may be controlled on the basis of empirical control data obtained beforehand through experiments or may be controlled by a feedback control operation. In regulating the openings of the variable throttle valves 50A, 50B by a feedback control operation, signals provided by the pressure gages 47 are transmitted to a CPU (controller) 300, and the servomotors 59 of the variable throttle valves 50 are controlled by control signals provided by the CPU 300.

Steps of the resist solubilizing process other than those described above are the same as those previously described in connection with the piping system shown in FIG. 3.

The third two-position valve 93 may be additionally used for regulating the pressure in the processing vessel 30A during the resist-solubilizing process; that is, pressure in the processing vessel 30A may be regulated by repetitively opening an closing the third two-position valve 93 of the exhaust selector 90A with the opening of the variable throttle valve 50A fixed at a proper level. Also, the third two-position valve 93 may be additionally used for regulating the pressure in the processing vessel 30B during the resist-solubilizing process; that is, pressure in the processing vessel 30B may be regulated by repetitively opening an closing the third two-position valve 93 of the exhaust selector 90B with the opening of the variable throttle valve 50B fixed at a proper level. Since an operation for opening and closing a valve can be more quickly achieved than an operation for adjusting the opening of the valve, the additional use of the selector valve 93 improves the accuracy of pressure regulation.

The regulation of the opening of the variable throttle valve 50A (50B) and the opening-and-closing operation of the third two-position valve 93 of the exhaust selector 90A (90B) may be simultaneously performed.

Figure 16:
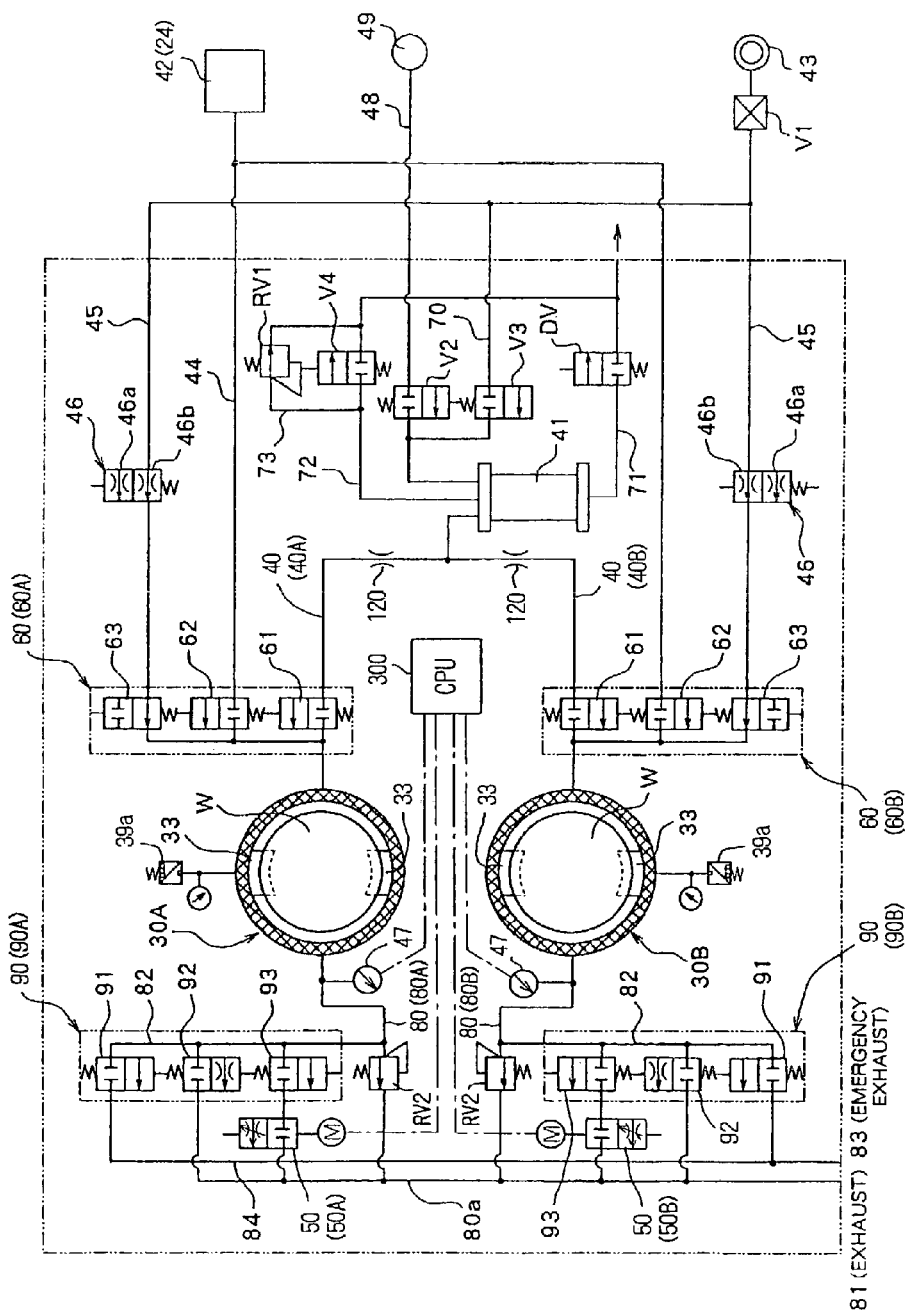
FIG. 16 is a piping diagram of a piping system included in a substrate processing apparatus in a fourth embodiment according to the present invention.

In an embodiment shown in FIG. 16, a CPU 300 controls the third two-position valve 93 by a feedback control operation based on measured pressure measured by a pressure gage 47, i.e., a pressure sensor. However, the feedback control operation is not necessarily mandatory. The pressure in a processing vessel 30A (30B) may be regulated by opening and closing the third two-position valve 93 according to a schedule empirically determined beforehand, provided that the pressure in a steam generator is stable. The pressure in a processing vessel 30A (30B) may also be regulated both by regulating the opening of the variable throttle valve 50A (50B) and opening and closing the third two-position valve 93 of the exhaust selector 90A (90B) simultaneously.

Although the foregoing embodiments have been described as applied to the substrate processing unit for removing the resist film coating the surface of the semiconductor wafer, the substrate processing unit may be an etching unit or a unit for processing a workpiece other than a semiconductor wafer, such as an LCD substrate. The processing gas is not limited to ozone gas, and the solvent vapor is not limited to steam.

What is claimed is:

1. A substrate processing apparatus comprising:
   a plurality of processing vessels each configured to process a substrate therein;
   a plurality of processing gas supply lines each adapted to carry a processing gas from a processing gas source to respective processing vessels;
   a plurality of solvent vapor supply lines each adapted to carry a solvent vapor from a solvent vapor source to respective processing vessels;
   a plurality of exhaust lines each adapted to carry the processing gas and the solvent vapor to discharge the processing gas and the solvent vapor from respective processing vessels; and
   a plurality of devices that regulate respective pressures in the processing vessels,
   wherein each of the solvent vapor lines is provided with at least one of said plurality of devices, or each of the exhaust lines is provided with at least one of said plurality of devices.

2. The apparatus according to claim 1, wherein each of the solvent vapor lines is provided with at least one of said plurality of devices.

3. The apparatus according to claim 2, wherein said at least one of the devices provided in each of the solvent vapor supply lines includes a variable throttle valve.

4. The apparatus according to claim 3 further comprising:
   a plurality of open-close valves, each operated between an open position and a closed position, at least one open-close valve provided in each of the solvent vapor supply lines to stop and permit a flow of the solvent vapor to each of the processing vessels; and
   a controller that regulates respective openings of the variable throttle valves in connection with the respective positions of the open-close valves.

5. The apparatus according to claim 2, wherein each of the processing gas supply lines is connected to a part, on a downstream side of said at least one of the devices provided in each of the solvent vapor supply lines, of respective solvent vapor supply lines.

6. The apparatus according to claim 1, wherein each of the exhaust lines is provided with at least one of said plurality of devices.

7. The apparatus according to claim 6, wherein said at least one of the devices provided in each of the exhaust lines includes a variable throttle valve.

8. The apparatus according to claim 7, wherein said at least one of the devices provided in each of the exhaust lines further includes a relief valve placed in parallel to the variable throttle valve.

9. The apparatus according to claim 7, wherein said at least one of the devices provided in each of the exhaust lines further includes an open-close valve placed in series with the variable throttle valve.

10. The apparatus according to claim 7 further comprising:
    a plurality of pressure sensors each adapted to measure pressure in respective processing vessels or pressure that varies according to a variation of the pressure in respective processing vessels; and
    a controller that controls an opening of the each of the variable throttle valves based on a result of a pressure measurement of each of the pressure sensors, so that a predetermined pressure is maintained in each of the processing vessels.

11. The apparatus according to claim 9 further comprising:
a plurality of pressure sensors each adapted to measure pressure in respective processing vessels or pressure that varies according to a variation of the pressure in respective processing vessels; and
a controller that controls an opening-and-closing operation of each of the open-close valves based on a result of an pressure measurement of each of the pressure sensors, so that a predetermined pressure is maintained in each of the processing vessels.

12. The apparatus according to claim 9 further comprising:
a plurality of open-close valves, each operated between an open position and a closed position, at least one open-close valve provided in each of the solvent vapor supply lines to stop and permit a flow of the solvent vapor to each of the processing vessels; and
a controller that controls the open-close valves provided in the exhaust lines for an opening-and-closing operation in connection with the respective positions of the open-close valves provided in the solvent vapor supply lines.

13. The apparatus according to claim 7 further comprising:
a plurality of open-close valves, each operated an open position and a closed position, at least one open-close valve provided in each of the solvent vapor supply lines to stop and permit a flow of the solvent vapor to each of the processing vessels; and
a controller that controls respective openings of the variable throttle valves in connection with the respective positions of the plurality of open-close valves.

14. The apparatus according to claim 6, wherein fixed restrictors are placed respectively in the solvent vapor supply lines.

15. The apparatus according to claim 1, wherein each of the processing vessels includes:
a vessel body provided with a mount configured to support a substrate thereon, and
a cover adapted to sealingly engage with the vessel body to define a processing space in the processing vessel, the cover having a substrate support member configured to support the substrate, the cover being configured so that the substrate is separated from the substrate support member of the cover and is supported on the mount of the vessel body when the cover engages with the vessel body.

16. A substrate processing apparatus comprising:
a first processing vessel configured to process a substrate therein;
a second processing vessel configured to process a substrate therein;
a first processing gas supply line adapted to carry a processing gas from a processing gas source into the first processing vessel;
a second processing gas supply line adapted to carry the processing gas from the processing gas source into the second processing vessel;
a first solvent vapor supply line adapted to carry a solvent vapor from a solvent vapor source into the first processing vessel;
a second solvent vapor supply line adapted to carry the solvent vapor from the solvent vapor source into the second processing vessel;
a first exhaust line adapted to carry the processing gas and the solvent vapor to discharge the processing gas and the solvent vapor from the first processing vessel;
a second exhaust line adapted to carry the processing gas and the solvent vapor to discharge the processing gas and the solvent vapor from the second processing vessel;
a first open-close valve placed in the first solvent vapor supply line;
a second open-close valve placed in the second solvent vapor supply line;
a first variable throttle valve placed in the first exhaust line;
a second variable throttle valve placed in the second exhaust line; and
a controller that controls an opening of the first variable throttle valve such that the opening of the first variable throttle valve when both the first and the second open-close valves are opened is different from that of the first variable throttle valve when the first open-close valve is opened and the second open-close valve is closed.

17. The apparatus according to claim 16 further comprising:
a third open-close valve placed in the first exhaust line in series with the first variable throttle valve; and
a fourth open-close valve placed in the second exhaust line in series with the second variable throttle valve,
wherein the controller is configured to control the third open-close valve for an opening-and-closing operation so that a predetermined pressure is maintained in the first processing vessel, and configured to control the fourth open-close valve for an opening-and-closing operation so that a predetermined pressure is maintained in the second processing vessel.

18. The apparatus according to claim 16, wherein a first relief valve is placed in the first exhaust line in parallel to the first variable throttle valve, and a second relief valve is placed in the second exhaust line in parallel to the second variable throttle valve.

19. A substrate processing apparatus comprising:
a processing vessel configured to process a substrate therein;
a supply line connected to the processing vessel to carry a mixed processing fluid containing a processing gas and a solvent vapor into the processing vessel;
an exhaust line connected to the processing vessel and capable of carrying the mixed processing fluid to discharge the mixed processing fluid from the processing vessel;
an open-close valve placed in the exhaust line, said open-close valve operating between only two positions, said open-close valve shutting off a flow of the mixed processing fluid flowing through the open-close valve when the open-close value is in one of the two positions, and the open-close valve allowing the mixed processing fluid through the open-close valve when the open-close valve is in the other of the two positions;
a variable throttle valve placed in the exhaust line at a position downstream of the open-close valve; and
a controller that controls an opening of the variable throttle valve and controls the open-close valve for an opening-and-closing operation so that a predetermined pressure is maintained in the processing vessel.

20. A substrate processing method comprising the steps of:
supplying a processing gas and a solvent vapor in a first time period into a first processing vessel holding a first substrate therein; and
supplying the processing gas and the solvent vapor in a second time period into a second processing vessel holding a second substrate therein;
wherein the solvent vapor supplied into the first processing vessel and the solvent vapor supplied into the second processing vessel is supplied by a common solvent vapor source,
said method further comprising the steps of:
regulating pressure in the first processing vessel in the first time period; and
regulating pressure in the second processing vessel in the second time period;
wherein,
the step of regulating the pressure in the first processing vessel is achieved by adjusting an opening of a first variable throttle valve, and the first variable throttle valve is placed in a first solvent vapor supply line that carries the solvent vapor into the first processing vessel or in a first exhaust line that carries the solvent vapor and the processing gas to discharge the solvent vapor and the processing gas from the first processing vessel;
the step of regulating the pressure in the second processing vessel is achieved by adjusting an opening of a second variable throttle valve, and the second variable throttle valve is placed in a second solvent vapor supply line that carries the solvent vapor into the second processing vessel or in a second exhaust line that carries the solvent vapor and the processing gas to discharge the solvent vapor and the processing gas from the second processing vessel;
only a part of the first time period overlaps the second time period; and
an opening of the first variable throttle valve in a state where the solvent vapor is being supplied to both the first and the second processing vessel, and an opening of the first variable throttle valve in a state where the solvent vapor is being supplied into the first processing vessel and is not being supplied into the second processing vessel, are different from each other.

21. The method according to claim 20, wherein the first variable throttle valve is placed in the first exhaust line, and the second variable throttle valve is placed in the second exhaust line.

22. The method according to claim 21, wherein a first relief valve is placed in the first exhaust line in parallel to the first variable throttle valve, and a second relief valve is placed in the second exhaust line in parallel to the second variable throttle valve;
said method further comprising the steps of:
supplying the processing gas into the first processing vessel without supplying the solvent vapor into the first processing vessel in a third time period preceding the first time period;
supplying the processing gas into the second processing vessel without supplying the solvent vapor into the second processing vessel in a fourth time period preceding the second time period;
regulating a pressure in the first processing vessel by using the first relief valve while the processing gas is being supplied into the first processing vessel in the third time period; and
regulating the pressure in the second processing vessel by using the second relief valve while the processing gas is being supplied into the second processing vessel in the fourth time-period.

23. The method according to claim 21, wherein:
a first open-close valve is placed in the first exhaust line in series with the first variable throttle valve, and a second open-close valve is placed in the second exhaust line in series with the second variable throttle valve;
the step of regulating the pressure in the first processing vessel during the first time period includes repetitively opening and closing the first open-close valve; and
the step of regulating the pressure in the second processing vessel during the second time period includes repetitively opening and closing the second open-close valve.

24. A substrate processing method comprising the steps of:
supplying a processing gas and a solvent vapor into a processing vessel holding a substrate therein; and
regulating pressure in the processing vessel at a pressure higher than an atmospheric pressure;
wherein the step of regulating the pressure in the processing vessel includes placing an open-close valve, operated between an open position and a closed position, in an exhaust line connected to the processing vessel, and placing a variable throttle valve, whose opening can be adjusted independently from a position of the open-close valve, in the exhaust line at a position downstream of the open-close valve; and
wherein the step of regulating the pressure in the processing vessel includes a step of adjusting an opening of the variable throttle valve and a step of repetitively opening and closing the open-close valve while the opening of the variable throttle valve is adjusted.

25. A substrate processing method comprising the steps of:
supplying a processing gas into a processing vessel holding a substrate therein in a first time period;
supplying the processing gas and a solvent vapor into the processing vessel in a second time period subsequent to the first time period;
regulating pressure in the processing vessel at a pressure higher than an atmospheric pressure in the first time period by using a relief valve placed in an exhaust line connected to the processing vessel; and
regulating the pressure in the processing vessel at a pressure higher than the atmospheric pressure in the second time period by adjusting an opening of a variable throttle valve placed in the exhaust line in parallel to the relief valve.

26. The method according to claim 25, wherein the step of regulating the pressure in the processing vessel in the second time period includes a step of repetitively opening and closing a open-close valve between an open and closed position while the opening of the variable throttle valve is adjusted, and
wherein the open-close valve is placed at a position upstream of the variable throttle valve in the exhaust line, and the variable throttle valve is configured so that the opening thereof can be adjusted independently from a position of the open-close valve.

27. The method according to claim 25, wherein a part of the exhaust line in which the variable throttle valve is placed is shut off in the first time period.

* * * * *